(12) United States Patent
Mikawa et al.

(10) Patent No.: US 9,184,381 B2
(45) Date of Patent: Nov. 10, 2015

(54) NONVOLATILE STORAGE ELEMENT AND METHOD FOR MANUFACTURING SAME

(75) Inventors: Takumi Mikawa, Shiga (JP); Yukio Hayakawa, Kyoto (JP); Takeki Ninomiya, Osaka (JP); Yoshio Kawashima, Osaka (JP); Shinichi Yoneda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/810,800

(22) PCT Filed: Oct. 6, 2011

(86) PCT No.: PCT/JP2011/005637
§ 371 (c)(1),
(2), (4) Date: Jan. 17, 2013

(87) PCT Pub. No.: WO2012/046454
PCT Pub. Date: Apr. 12, 2012

(65) Prior Publication Data
US 2013/0119344 A1    May 16, 2013

(30) Foreign Application Priority Data

Oct. 8, 2010    (JP) ................. 2010-229096

(51) Int. Cl.
*H01L 47/00*    (2006.01)
*H01L 45/00*    (2006.01)
*H01L 27/10*    (2006.01)

(52) U.S. Cl.
CPC ............ *H01L 45/145* (2013.01); *H01L 27/101* (2013.01); *H01L 45/08* (2013.01); *H01L 45/146* (2013.01); *H01L 45/1608* (2013.01); *H01L 45/1625* (2013.01)

(58) Field of Classification Search
CPC ... H01L 21/76886; H01L 22/14; H01L 27/24; H01L 29/66446; H01L 45/04
See application file for complete search history.

(56) References Cited

U.S. PATENT DOCUMENTS

| 7,521,704 B2 | 4/2009 | Lee et al. |
| 7,560,724 B2 | 7/2009 | Aratani et al. |

(Continued)

FOREIGN PATENT DOCUMENTS

| CN | 101621114 | 1/2010 |
| JP | 2005-317976 | 11/2005 |

(Continued)

OTHER PUBLICATIONS

International Search Report issued Nov. 8, 2011 in International (PCT) Application No. PCT/JP2011/005637.

(Continued)

*Primary Examiner* — Selim Ahmed
*Assistant Examiner* — Moin Rahman
(74) *Attorney, Agent, or Firm* — Wenderoth, Lind & Ponack, L.L.P.

(57) ABSTRACT

A variable resistance nonvolatile storage element includes: a first electrode; a second electrode; and a variable resistance layer having a resistance value that reversibly changes based on an electrical signal applied between the electrodes, wherein the variable resistance layer has a structure formed by stacking a first transition metal oxide layer, a second transition metal oxide layer, and a third transition metal oxide layer in this order, the first transition metal oxide layer having a composition expressed as $MO_x$ (where M is a transition metal and O is oxygen), the second transition metal oxide layer having a composition expressed as $MO_y$ (where x>y), and the third transition metal oxide layer having a composition expressed as $MO_z$ (where y>z).

17 Claims, 17 Drawing Sheets

(56) References Cited

U.S. PATENT DOCUMENTS

| | | | |
|---|---|---|---|
| 8,022,502 | B2 | 9/2011 | Kanzawa et al. |
| 8,188,466 | B2 | 5/2012 | Kawano et al. |
| 8,264,865 | B2 | 9/2012 | Mitani et al. |
| 8,279,658 | B2 | 10/2012 | Muraoka et al. |
| 8,395,930 | B2 | 3/2013 | Muraoka et al. |
| 2005/0247921 | A1* | 11/2005 | Lee et al. ............ 257/2 |
| 2008/0083918 | A1 | 4/2008 | Aratani et al. |
| 2009/0020745 | A1* | 1/2009 | Jeong et al. ......... 257/4 |
| 2009/0039332 | A1* | 2/2009 | Lee et al. ............ 257/4 |
| 2009/0218565 | A1 | 9/2009 | Kawano et al. |
| 2009/0224224 | A1 | 9/2009 | Fujii et al. |
| 2009/0283736 | A1 | 11/2009 | Kanzawa et al. |
| 2010/0021626 | A1 | 1/2010 | Hsieh et al. |
| 2010/0133496 | A1* | 6/2010 | Lee ............... H01L 45/04 257/2 |
| 2010/0207094 | A1 | 8/2010 | Kanzawa et al. |
| 2011/0002154 | A1 | 1/2011 | Mitani et al. |
| 2011/0006278 | A1* | 1/2011 | Takahashi ............ 257/4 |
| 2011/0080770 | A1 | 4/2011 | Muraoka et al. |
| 2011/0240942 | A1 | 10/2011 | Tsuji et al. |
| 2011/0294259 | A1 | 12/2011 | Kanzawa et al. |
| 2012/0320661 | A1 | 12/2012 | Muraoka et al. |

FOREIGN PATENT DOCUMENTS

| | | |
|---|---|---|
| JP | 2006-040946 | 2/2006 |
| JP | 2007-180174 | 7/2007 |
| JP | 2008-098537 | 4/2008 |
| JP | 2009-021524 | 1/2009 |
| JP | 2009-105383 | 5/2009 |
| JP | 2010-021381 | 1/2010 |
| JP | 2010-177387 | 8/2010 |
| JP | 2010-251352 | 11/2010 |
| WO | 2008/059701 | 5/2008 |
| WO | 2008/149484 | 12/2008 |
| WO | 2009/050833 | 4/2009 |
| WO | 2010/004705 | 1/2010 |
| WO | 2010/067585 | 6/2010 |
| WO | 2010/109876 | 9/2010 |

OTHER PUBLICATIONS

Extended European Search Report issued Mar. 31, 2015 in corresponding European Patent Application No. 11830388.2.
Written Opinion of the International Searching Authority issued Nov. 8, 2011 in International (PCT) Application No. PCT/JP2011/005637.
International Preliminary Examination Report issued Nov. 6, 2012 in International (PCT) Application No. PCT/JP2011/005637.

* cited by examiner

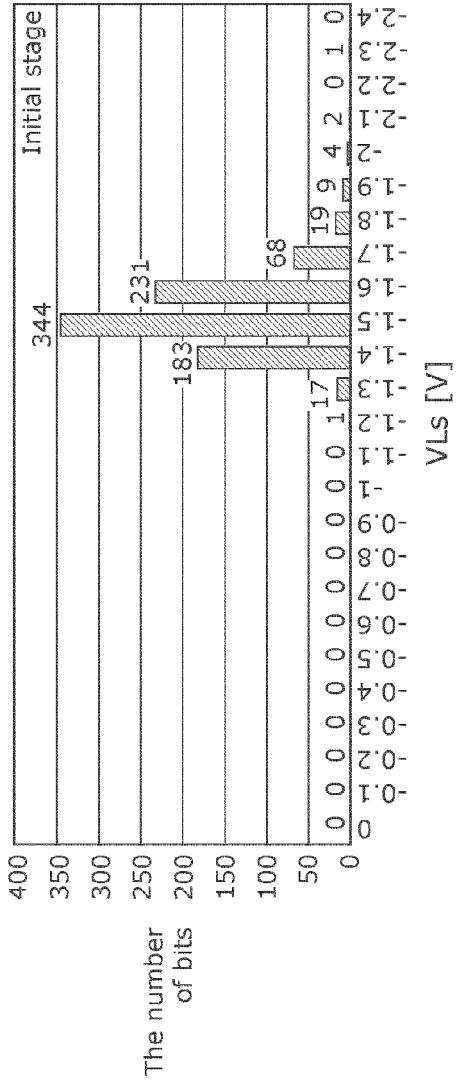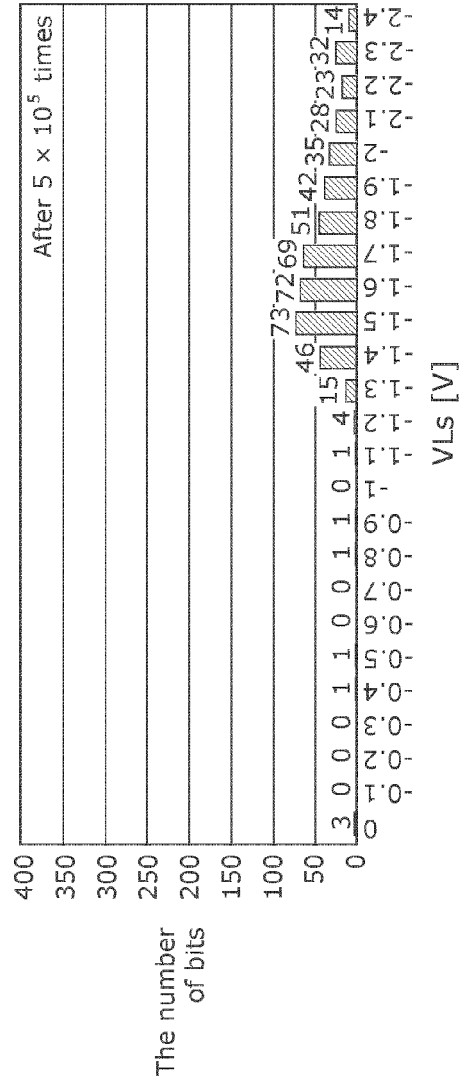

NONVOLATILE STORAGE ELEMENT AND METHOD FOR MANUFACTURING SAME

BACKGROUND OF INVENTION

1. Technical Field

The present invention relates to a variable resistance nonvolatile storage element whose resistance value changes due to application of voltage pulses.

2. Background Art

In recent years, along with the progress of digital technology, electronic devices such as portable information devices and home information appliances have further become highly functional. As the functions of these electronic devices have become more sophisticated, miniaturized and high-speed semiconductor elements used in the electronic devices have been rapidly developed. Among the semiconductor elements, nonvolatile memories having a large capacity as represented by flash memories have been increasingly used for various purposes. Moreover, research and development of variable resistance nonvolatile memory devices using so-called variable resistance elements as next-generation new nonvolatile memories in place of the flash memories has been in progress. Here, a variable resistance element refers to an element that has characteristics that its resistance value reversibly changes due to electrical signals, and is further capable of storing information corresponding to the resistance value in a nonvolatile manner.

A nonvolatile storage element whose variable resistance layer is formed by stacking transition metal oxides having different oxygen content atomic percentages has been proposed as an example of the variable resistance element. It is disclosed that resistance change is stabilized by selectively causing oxidation and reduction reaction in an interface between a variable resistance layer having a high oxygen content atomic percentage and an electrode in contact with the variable resistance layer (see Patent Literature (PTL) 1, for instance).

FIG. 13 shows a variable resistance nonvolatile storage element 90 including a conventional variable resistance element 90a. A first line 101 is formed on a substrate 100, and a first interlayer insulating layer 102 is formed to cover the first line 100. A first contact plug 103 to be connected to the first line 101 is formed to penetrate the first interlayer insulating layer 102. The variable resistance element 90a that includes a second electrode (here, lower electrode) 104 on the first interlayer insulating layer 102, a variable resistance layer 105, and a first electrode (here, upper electrode) 106 is formed to cover the first contact plug 103. A second interlayer insulating layer 107 is formed to cover the variable resistance element 90a, and a second contact plug 108 that penetrates the second interlayer insulating layer 107 connects the first electrode 106 and a second line 109. The variable resistance layer 105 has a stack structure of a first transition metal oxide layer 105x and a second transition metal oxide layer 105y, and comprises transition metal oxides of the same type. A transition metal oxide comprised in the first transition metal oxide layer 105x has an oxygen content atomic percentage higher than that of a transition metal oxide comprised in the second transition metal oxide layer 105y.

With such a structure, when a voltage is applied to the variable resistance element 90a, most of the voltage is applied to the first transition metal oxide layer 105x having the high oxygen content atomic percentage and indicating a higher resistance value. Moreover, oxygen that is capable of contributing to reaction is abundant near an interface between the first electrode 106 and the first transition metal oxide layer 105x. Thus, the oxidation and the reduction reaction selectively occur in the interface, thereby stabilizing resistance change.

CITATION LIST

Patent Literature

[PTL 1] International Publication WO 2008/149484

TECHNICAL PROBLEM

Regarding the conventionally structured variable resistance element described above, however, it has been discovered that the nonvolatile storage element that initially operated stably becomes unstable while continuously operating and starts malfunctioning.

SUMMARY OF INVENTION

The present invention is conceived to solve the problem, and is intended to reduce an occurrence of the nonvolatile storage element malfunctioning, and significantly decrease its probability. In addition, the present invention is intended to reduce an occurrence of deterioration of an oxygen profile in the nonvolatile storage element, and a variation in resistance change characteristics of each bit. In other words, an object of the present invention is to provide a variable resistance nonvolatile storage element suitable for a larger capacity, and a method for manufacturing the same.

SOLUTION TO PROBLEM

In order to achieve the object, a nonvolatile storage element according to an aspect of the present invention includes: a first electrode; a second electrode; and a variable resistance layer provided between the first electrode and the second electrode, and having a resistance value that reversibly changes based on an electrical signal applied between the first electrode and the second electrode, wherein the variable resistance layer has a structure formed by stacking a first transition metal oxide layer, a second transition metal oxide layer, and a third transition metal oxide layer in this order, the first transition metal oxide layer having a composition expressed as $MO_x$ (where M is a transition metal and O is oxygen), the second transition metal oxide layer having a composition expressed as $MO_y$ (where x>y), and the third transition metal oxide layer having a composition expressed as $MO_z$ (where y>z).

Here, the first transition metal oxide layer may be a layer in which a filament path is formed, the filament path being a micro region of which resistance changes. Moreover, the nonvolatile storage element may be an element of which resistance can change when a filament path is formed in the first transition metal oxide layer, the filament path being a micro region of which resistance changes, after initial breakdown of the nonvolatile storage element is performed by applying, to the nonvolatile storage element, a voltage having an absolute value higher than an absolute value of a voltage applied in a normal operation. Furthermore, the first transition metal oxide layer may be an insulating layer before initial breakdown of the nonvolatile storage element is performed.

With such a structure, for instance, by providing the first transition metal oxide layer having the highest oxygen content atomic percentage to be in contact with the first electrode and the third transition metal oxide layer having the lowest oxygen content atomic percentage to be in contact with the second electrode, it is possible to surely perform a resistance change operation in a region of the variable resistance layer near the interface between the first electrode and the first transition metal oxide layer, to stabilize a polarity of resistance change, and at the same time reduce an occurrence of a resistance change operation (malfunction) in a region of the variable resistance layer near the interface between the second electrode and the third transition metal oxide layer, to achieve stable memory characteristics. This is because, in the resistance change operation mechanism, oxidation and reduction reaction of a transition metal oxide layer near an interface of an electrode are dominant, and a resistance change operation is preferentially performed in an interface in which the oxidation and the reduction reaction are prone to occur.

Because the first transition metal oxide layer having the highest oxygen content atomic percentage is a layer that directly affects the occurrence of the resistance change and the resistance change occurs near the interface of the electrode, it is not necessary to increase a film thickness of the first transition metal oxide layer, and preferably the first transition metal oxide layer is relatively thin. This is because when the film thickness of the first transition metal oxide layer is increased, a higher breakdown voltage is required, which is disadvantageous to low power consumption. In particular, when the film thickness of the first transition metal oxide layer is increased to 10 nm or more, it is difficult to perform breakdown, and a filament cannot be formed.

On the other hand, when the second transition metal oxide layer is used as a main layer and the third transition metal oxide layer is used to prevent resistance change from occurring at an opposite electrode, the second transition metal oxide layer may have a film thickness greater than film thicknesses of the first transition metal oxide layer and the third transition metal oxide layer. With this structure, it is possible to expand a line of electric force of a path through which current flows in the second transition metal oxide layer, to increase a cell current, and at the same time prevent the malfunction from occurring at the opposite electrode.

Moreover, when the second transition metal oxide is used as an oxygen diffusion preventing layer and the third transition metal oxide is used as the main layer, the third transition metal oxide layer may have a film thickness greater than film thicknesses of the first transition metal oxide layer and the second transition metal oxide layer. With this structure, it is possible to expand a line of electric force of a path through which current flows in the third transition metal oxide layer, to increase a cell current, and at the same time the second transition metal oxide layer makes it possible to prevent the oxygen from diffusing from the first transition metal oxide layer to the third transition metal oxide layer that is below the first transition metal oxide layer. Having a film thickness as thin as approximately 10 nm, the second transition metal oxide layer sufficiently serves as an oxygen barrier.

Furthermore, for example, by providing, between the first transition metal oxide layer having a high oxygen content atomic percentage and the third transition metal oxide layer having a low oxygen content atomic percentage, the second transition metal oxide layer having an oxygen content atomic percentage midway between the oxygen content atomic percentages, it is possible to decrease a difference in oxygen content atomic percentage between the first transition metal oxide layer having the high oxygen content atomic percentage and the third transition metal oxide layer having the low oxygen content atomic percentage, to reduce an amount of diffusing oxygen ions. Consequently, the structure reduces, as a whole, an occurrence of deterioration of the oxygen profile in the variable resistance layer, and a variation in oxygen profile for each bit, thereby reducing a variation in resistance change characteristics as a memory cell array.

Moreover, the variable resistance layer may have a structure formed by stacking the first transition metal oxide layer, the second transition metal oxide layer, the third transition metal oxide layer, and a fourth transition metal oxide layer in this order, the first transition metal oxide layer having a composition expressed as $MO_x$ (where M is a transition metal and O is oxygen), the second transition metal oxide layer having a composition expressed as $MO_y$ (where x>y), the third transition metal oxide layer having a composition expressed as $MO_z$ (where y>z), and the fourth transition metal oxide layer having a composition expressed as $MO_a$ (where z>a).

With this structure, it is possible to reduce the occurrence of the deterioration of the oxygen profile by providing, below the first transition metal oxide layer having the highest oxygen content atomic percentage, the second transition metal oxide layer having a slight difference in oxygen content atomic percentage from the first transition metal oxide layer, and at the same time it is possible to reduce the occurrence of the resistance change operation (malfunction) in the region near the interface of the second electrode connected to the fourth transition metal oxide layer, by further providing, below the third transition metal oxide layer, the fourth transition metal oxide layer having a low oxygen content atomic percentage. The both effects make it possible to achieve a nonvolatile storage element that has a less variation in resistance change characteristics and is highly reliable.

Furthermore, in the nonvolatile storage element, the first electrode and the first transition metal oxide layer may be connected to each other, the second electrode and the third transition metal oxide layer may be connected to each other, the first electrode and the second electrode may include respective materials having mutually different chemical elements as main components, and a standard electrode potential V1 of the first electrode, a standard electrode potential V2 of the second electrode, and a standard electrode potential Vt of the transition metal M may satisfy Vt<V1 and V2<V1.

A higher standard electrode potential means less prone to oxidation. As a result, when an electrode is made of a material having a high standard electrode potential, the electrode is less prone to oxidation, and thus the oxygen ions are efficiently used for oxidation reaction of the variable resistance layer.

With such a structure, it is possible to fix, to the neighborhood of the first electrode having the higher standard electrode potential V1, a region of which resistance changes in the variable resistance layer, and reduce the occurrence of the malfunction in the neighborhood of the interface of the second electrode having the standard electrode potential V2 lower than the first standard electrode potential V1 of the first electrode. In other words, it is possible to achieve a nonvolatile storage element that more stably performs a resistance change operation, by always stabilizing the polarity of the resistance change.

Moreover, in the nonvolatile storage element including the above electrodes, the first electrode having the high standard electrode potential may be provided above the second electrode. In this case, it is difficult to etch, for instance, a precious metal represented as a material having a high standard electrode potential, and thus providing the first electrode made of the precious metal above the second electrode makes it easier to form the variable resistance element by using the first electrode as a mask and etching the variable resistance layer or the second electrode. In addition, when the first transition metal oxide layer is formed, it is possible to use a manufacturing method such as oxidizing a surface of the second transition metal oxide layer and injecting oxygen ions into the surface of the second transition metal oxide layer, thereby making it easy to control the oxygen profile of the first transition metal oxide layer in the variable resistance layer.

Conversely, in the nonvolatile storage element including the above electrodes, the first electrode may be provided below the second electrode. In this case, since the first electrode provided below can be sintered in advance, for example, at a high temperature before the variable resistance layer is formed so that migration is prevented from occurring in the first electrode in a post process, it is possible to stabilize the interface between the first electrode and the first transition metal oxide layer, to achieve stable device operations.

In the nonvolatile storage element, the first transition metal oxide layer, the second transition metal oxide layer, and the third transition metal oxide layer may comprise a tantalum oxide, a hafnium oxide, or a zirconium oxide as a variable resistance material. Any of the stack structures of the transition metal oxides makes it possible to achieve the nonvolatile storage element of which resistance changes due to the oxidation-reduction reaction of the layer having a high oxygen concentration and which has reversibly stable characteristics of writing to cause resistance change and satisfactory resistance value retention characteristics in addition to a high-speed operation capability. In addition, the nonvolatile storage element can be manufactured through a manufacturing process having a high compatibility with a normal silicon semiconductor process.

When the variable resistance layer includes the first transition metal oxide layer having a high oxygen concentration, the second transition metal oxide layer having a low oxygen concentration, and the third transition metal oxide layer having an ultralow oxygen concentration, the oxygen content atomic percentages of the respective transition metal oxide layers are as follows.

In the case of a tantalum oxide, when the first transition metal oxide layer having the high oxygen concentration, the second transition metal oxide layer having the low oxygen concentration, and the third transition metal oxide layer having the ultralow oxygen concentration are expressed as $TaO_x$, $TaO_y$, and $TaO_z$, respectively, $TaO_x$, $TaO_y$, and $TaO_z$ may satisfy $2.1 \leq x$, $0.8 \leq y \leq 1.9$, and $0 < z < 0.8$.

In the case of a hafnium oxide, when the first transition metal oxide layer having the high oxygen concentration, the second transition metal oxide layer having the low oxygen concentration, and the third transition metal oxide layer having the ultralow oxygen concentration are expressed as $HfO_x$, $HfO_y$, and $HfO_z$, respectively, $HfO_x$, $HfO_y$, and $HfO_z$ may satisfy $1.8 \leq x$, $0.9 \leq y \leq 1.6$, and $0 < z < 0.9$. In the case of a zirconium oxide, when the first transition metal oxide layer having the high oxygen concentration, the second transition metal oxide layer having the low oxygen concentration, and the third transition metal oxide layer having the ultralow oxygen concentration are expressed as $ZrO_x$, $ZrO_y$, and $ZrO_z$, respectively, $ZrO_x$, $ZrO_y$, and $ZrO_z$ may satisfy $1.9 \leq x$, $0.9 \leq y \leq 1.4$, and $0 < z < 0.9$. With these structures, the oxidation and the reduction reaction near the interface of the first electrode are facilitated, and the oxidation and the reduction reaction near the interface of the second electrode are surely inhibited, thereby achieving the stable device operations.

Furthermore, when the variable resistance layer includes the first transition metal oxide layer having a high oxygen concentration, the second transition metal oxide layer having a medium oxygen concentration, and the third transition metal oxide layer having a low oxygen concentration, the oxygen content atomic percentages of the respective transition metal oxide layers are as follows.

In the case of the tantalum oxide, when the first transition metal oxide layer having the high oxygen concentration, the second transition metal oxide layer having the medium oxygen concentration, and the third transition metal oxide layer having the low oxygen concentration are expressed as $TaO_x$, $TaO_y$, and $TaO_z$, respectively, $TaO_x$, $TaO_y$, and $TaO_z$ may satisfy $2.1 \leq x$, $0.8 \leq y \leq 1.9$, $0.8 \leq z \leq 1.9$, and $z < y$.

In the case of the hafnium oxide, when the first transition metal oxide layer having the high oxygen concentration, the second transition metal oxide layer having the medium oxygen concentration, and the third transition metal oxide layer having the low oxygen concentration are expressed as $HfO_x$, $HfO_y$, and $HfO_z$, respectively, $HfO_x$, $HfO_y$, and $HfO_z$ may satisfy $1.8 \leq x$, $0.9 \leq y \leq 1.6$, $0.9 \leq z \leq 1.6$, and $z < y$.

In the case of the zirconium oxide, when the first transition metal oxide layer having the high oxygen concentration, the second transition metal oxide layer having the medium oxygen concentration, and the third transition metal oxide layer having the low oxygen concentration are expressed as $ZrO_x$, $ZrO_y$, and $ZrO_z$, respectively, $ZrO_x$, $ZrO_y$, and $ZrO_z$ may satisfy $1.9 \leq x$, $0.9 \leq y \leq 1.4$, $0.9 \leq z \leq 1.4$, and $z < y$. With these structures, the oxidation and the reduction reaction near the interface of the first electrode are facilitated, and the oxidation and the reduction reaction near the interface of the second electrode are surely inhibited, thereby achieving the stable device operations.

A first method for manufacturing a nonvolatile storage element according to another aspect of the present invention includes: forming a second electrode on a substrate; forming a third transition metal oxide layer on the second electrode, the third transition metal oxide layer having a composition expressed as $MO_z$ (where M is a transition metal and O is oxygen); forming a second transition metal oxide layer on the third transition metal oxide layer, the second transition metal oxide layer having a composition expressed as $MO_y$ (where $y > z$); forming a first transition metal oxide layer on the second transition metal oxide layer, the first transition metal oxide layer having a composition expressed as $MO_x$ (where $x > y$); and forming a first electrode on the first transition metal oxide layer, wherein at least the second transition metal oxide layer and the third transition metal oxide layer are formed by reactive sputtering in an oxygen atmosphere. The first transition metal oxide layer may be formed by the reactive sputtering in the oxygen atmosphere, and the second transition metal oxide layer may be oxidized.

Moreover, a second method for manufacturing a nonvolatile storage element according to still another aspect of the present invention includes: forming a first electrode on a substrate; forming a first transition metal oxide layer on the first electrode, the first transition metal oxide layer having a composition expressed as $MO_x$ (where M is a transition metal and O is oxygen); forming a second transition metal oxide layer on the first transition metal oxide layer, the second transition metal oxide layer having a composition expressed as $MO_y$ (where $x > y$); forming a third transition metal oxide layer on the second transition metal oxide layer, the third transition metal oxide layer having a composition expressed as $MO_z$ (where $y > z$); and forming a second electrode on the third transition metal oxide layer, wherein the first transition metal oxide layer, the second transition metal oxide layer, and the third transition metal oxide layer are formed by reactive sputtering in an oxygen atmosphere.

The above manufacturing methods make it possible to form the transition metal oxide layers comprising the respective transition metal oxides having mutually different oxygen content atomic percentages according to oxygen flow rates, and differentiate the first, second, and third transition metal oxide layers. Thus, the first manufacturing method makes it possible to manufacture a nonvolatile storage element that selectively causes the oxidation and the reduction reaction of the variable resistance layer on the side of the upper electrode, to always stabilize the polarity of the resistance change, and at the same time reduce the occurrence of the resistance change operation (malfunction) in the region near the interface of the opposite electrode, to achieve the stable memory characteristics, and the second method makes it possible to manufacture a nonvolatile storage element that selectively causes the oxidation and the reduction reaction of the variable resistance layer on the side of the lower electrode, to always stabilize the polarity of the resistance change, and at the same time reduce the occurrence of the resistance change operation (malfunction) in the region near the interface of the opposite electrode, to achieve the stable memory characteristics.

Moreover, the first and second methods for manufacturing a nonvolatile storage element may further include oxidizing the first transition metal oxide layer.

With such manufacturing methods, it is possible to further increase the oxygen content atomic percentage of the first transition metal oxide layer, and produce an effect of reducing the leak current. In addition, it is possible to reduce the influence of the oxygen diffusion caused by the heat treatment in the post process, and more surely cause the oxidation and the reduction reaction in one of the electrodes.

Furthermore, the first and second methods for manufacturing a nonvolatile storage element may further include forming, in the first transition metal oxide layer, a filament path that is a micro region of which resistance changes, by applying, between the first electrode and the second electrode, an initial breakdown voltage having an absolute value higher than an absolute value of a voltage applied in a normal operation.

With such methods, it is possible to provide a nonvolatile storage element of which resistance stably changes from the beginning.

ADVANTAGEOUS EFFECTS OF INVENTION

A nonvolatile storage element according to the present invention produces an advantageous effect of achieving stable memory characteristics by making sure that resistance of a first transition metal oxide layer changes in a region near an interface of a first electrode and reducing an occurrence of resistance change (malfunction) of a third transition metal oxide layer in a region near an interface of a second electrode, by providing (i) a variable resistance layer having a three-layer structure of the first transition metal oxide layer being in contact with the first electrode that causes the resistance change and having the highest oxygen content atomic percentage, a second transition metal oxide layer that is a body which supplies oxygen to the first transition metal oxide layer, and the third transition metal oxide layer being in contact with an electrode that causes no resistance change and having the lowest oxygen content atomic percentage, and (ii) the second electrode in contact with the third transition metal oxide layer. The nonvolatile storage element also produces an advantageous effect of reducing deterioration of an oxygen profile by reducing an amount of oxygen diffusing from the first transition metal oxide layer that significantly affects especially resistance change characteristics and having the high oxygen content atomic percentage to the second transition metal oxide layer having the low oxygen content atomic percentage, thereby reducing a variation in resistance change characteristics for each bit. In other words, it is possible to prevent the oxygen from increasing near the interface of the electrode where resistance change does not occur, achieve a stable operation of initial breakdown, prevent an operating voltage from increasing or varying, and enhance the reliability of the number of operations of writing to cause resistance change. In particular, it is possible to significantly reduce a probability of a malfunction of part of bits in a large-capacity gigabit-class (Gbit) memory, thereby realizing a large-capacity nonvolatile memory.

Figure 3:
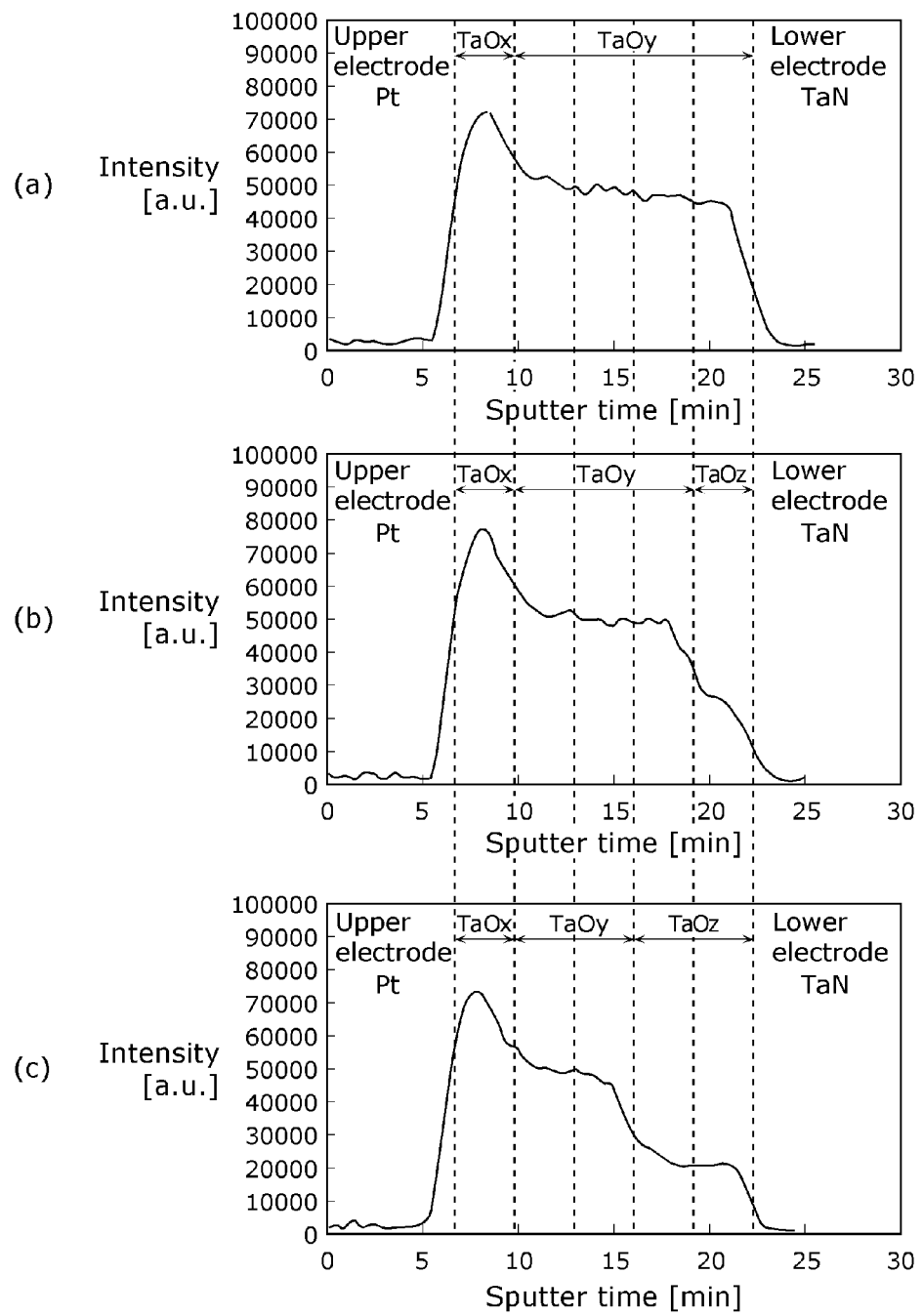

Each of (a) to (c) in FIG. 3 is a graph showing an oxygen profile in a variable resistance layer comprising a tantalum oxide and included in the nonvolatile storage element.

Figure 4:
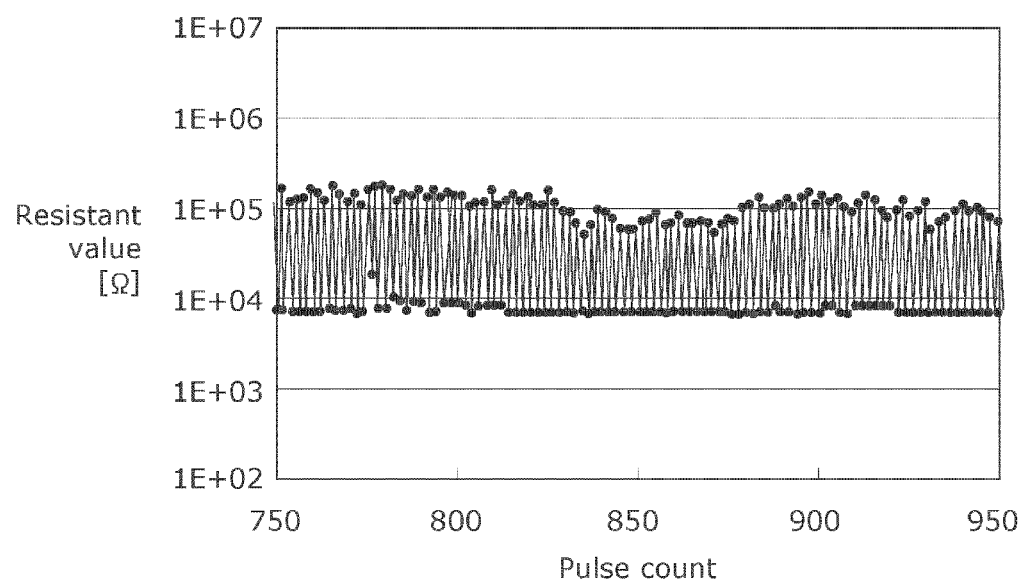

FIG. 4 is a graph showing a resistance value and pulse count characteristics of the nonvolatile storage element according to Embodiment 1 of the present invention.

Figure 5A:
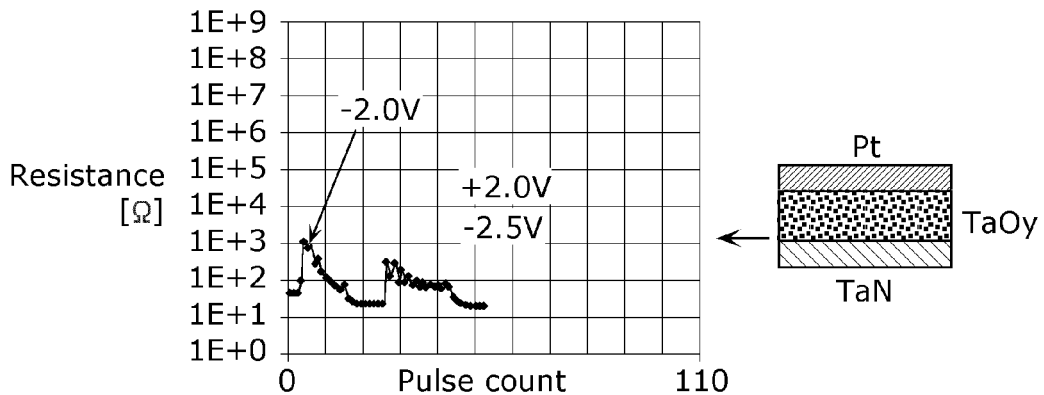

FIG. 5A is a first graph showing resistance change characteristics in a second electrode of the nonvolatile storage element.

Figure 5B:
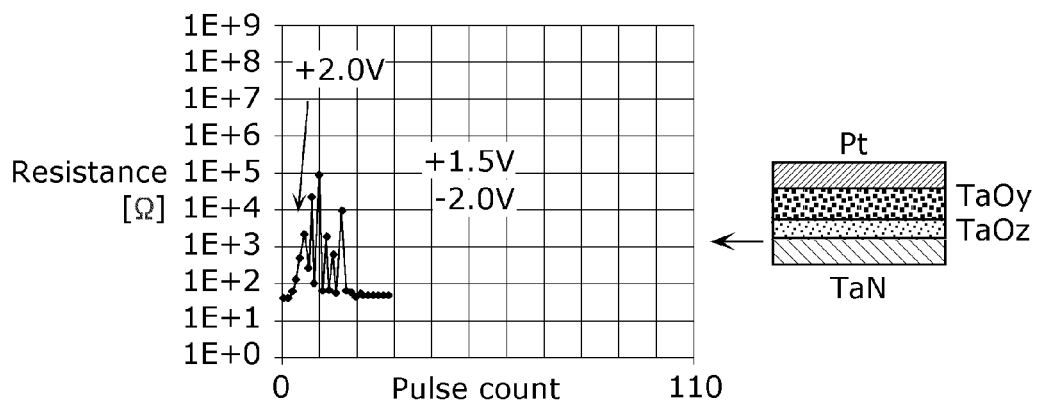

FIG. 5B is a second graph showing resistance change characteristics in the second electrode of the nonvolatile storage element.

Figure 5C:
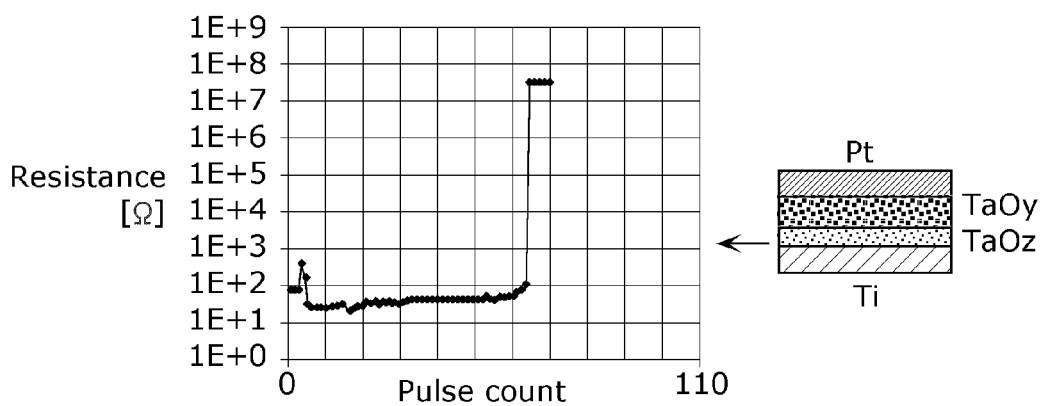

FIG. 5C is a third graph showing resistance change characteristics in the second electrode of the nonvolatile storage element.

Figure 6:
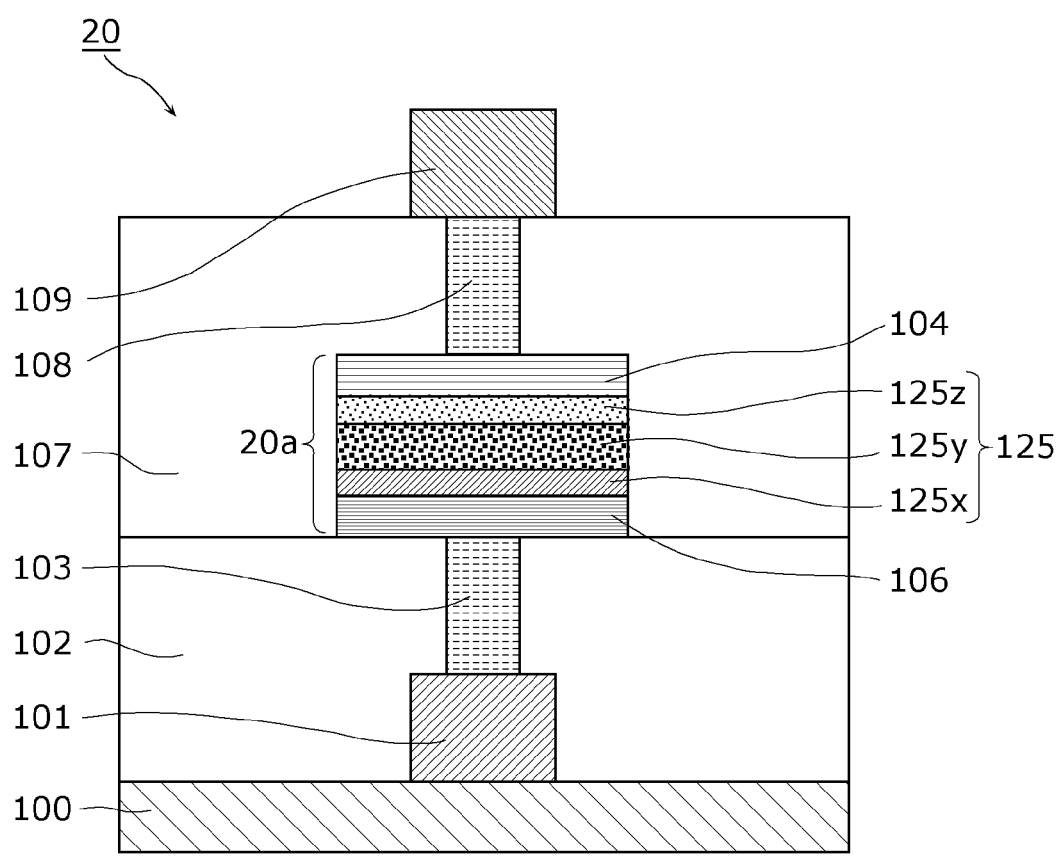

FIG. 6 is a cross-sectional view showing an exemplary structure of a nonvolatile storage element according to Embodiment 2 of the present invention.

Figure 7A:
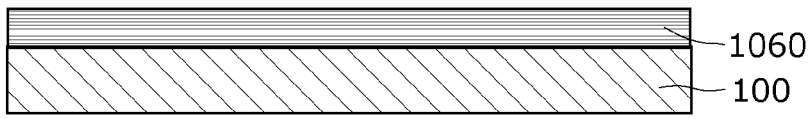

FIG. 7A is a cross-sectional view showing a method for manufacturing the principal part of the nonvolatile storage element according to Embodiment 2 of the present invention.

Figure 7B:
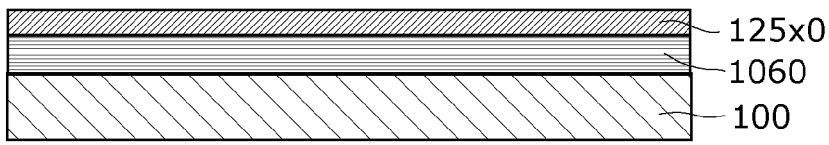

FIG. 7B is a cross-sectional view subsequent to FIG. 7A and showing the method for manufacturing the principal part of the nonvolatile storage element according to Embodiment 2 of the present invention.

Figure 7C:
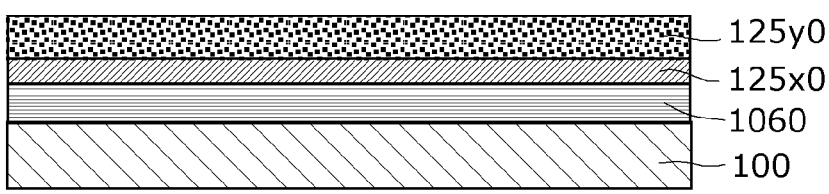

FIG. 7C is a cross-sectional view subsequent to FIG. 7B and showing the method for manufacturing the principal part of the nonvolatile storage element according to Embodiment 2 of the present invention.

Figure 7D:
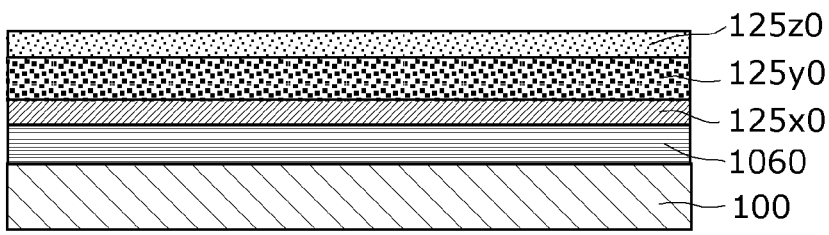

FIG. 7D is a cross-sectional view subsequent to FIG. 7C and showing the method for manufacturing the principal part of the nonvolatile storage element according to Embodiment 2 of the present invention.

Figure 7E:
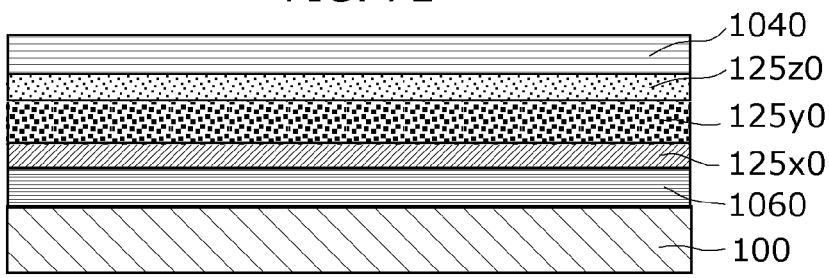

FIG. 7E is a cross-sectional view subsequent to FIG. 7D and showing the method for manufacturing the principal part of the nonvolatile storage element according to Embodiment 2 of the present invention.

Figure 7F:
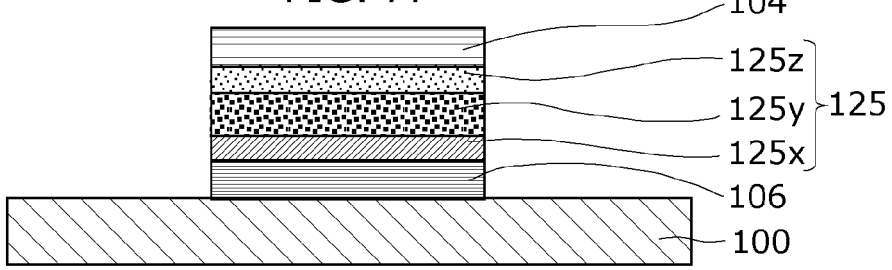

FIG. 7F is a cross-sectional view subsequent to FIG. 7E and showing the method for manufacturing the principal part of the nonvolatile storage element according to Embodiment 2 of the present invention.

Figure 8:
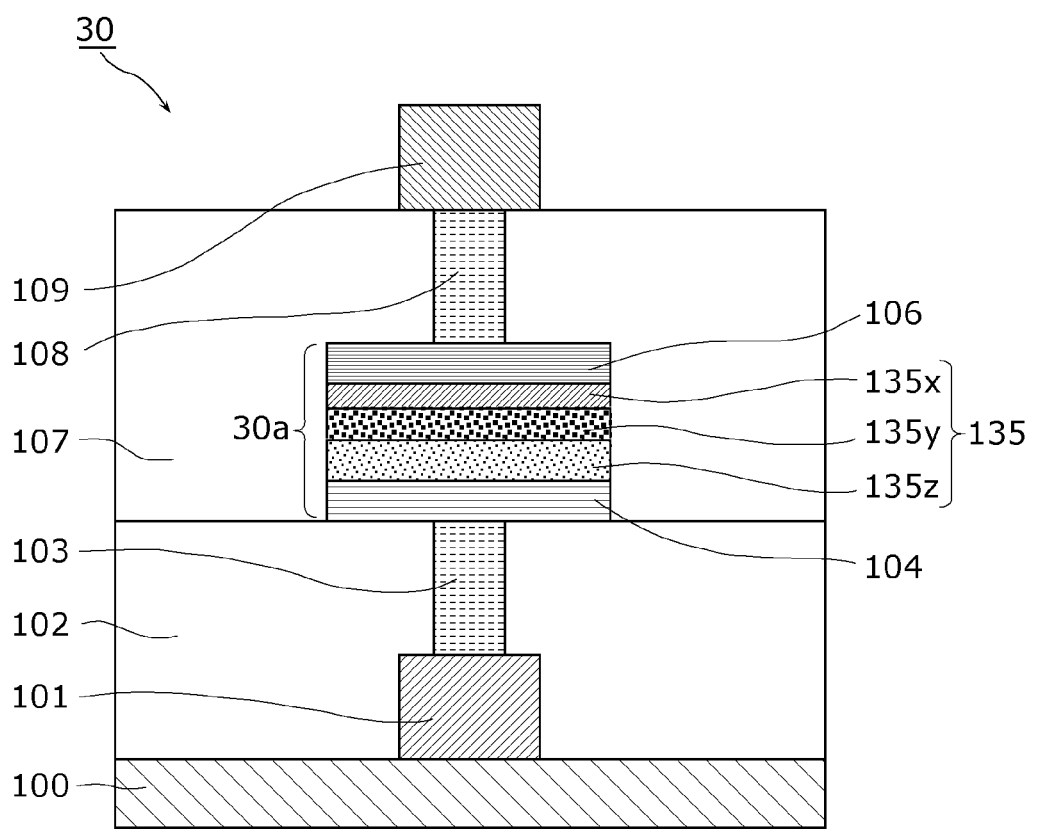

FIG. 8 is a cross-sectional view showing an exemplary structure of a nonvolatile storage element according to Embodiment 3 of the present invention.

Figure 9:
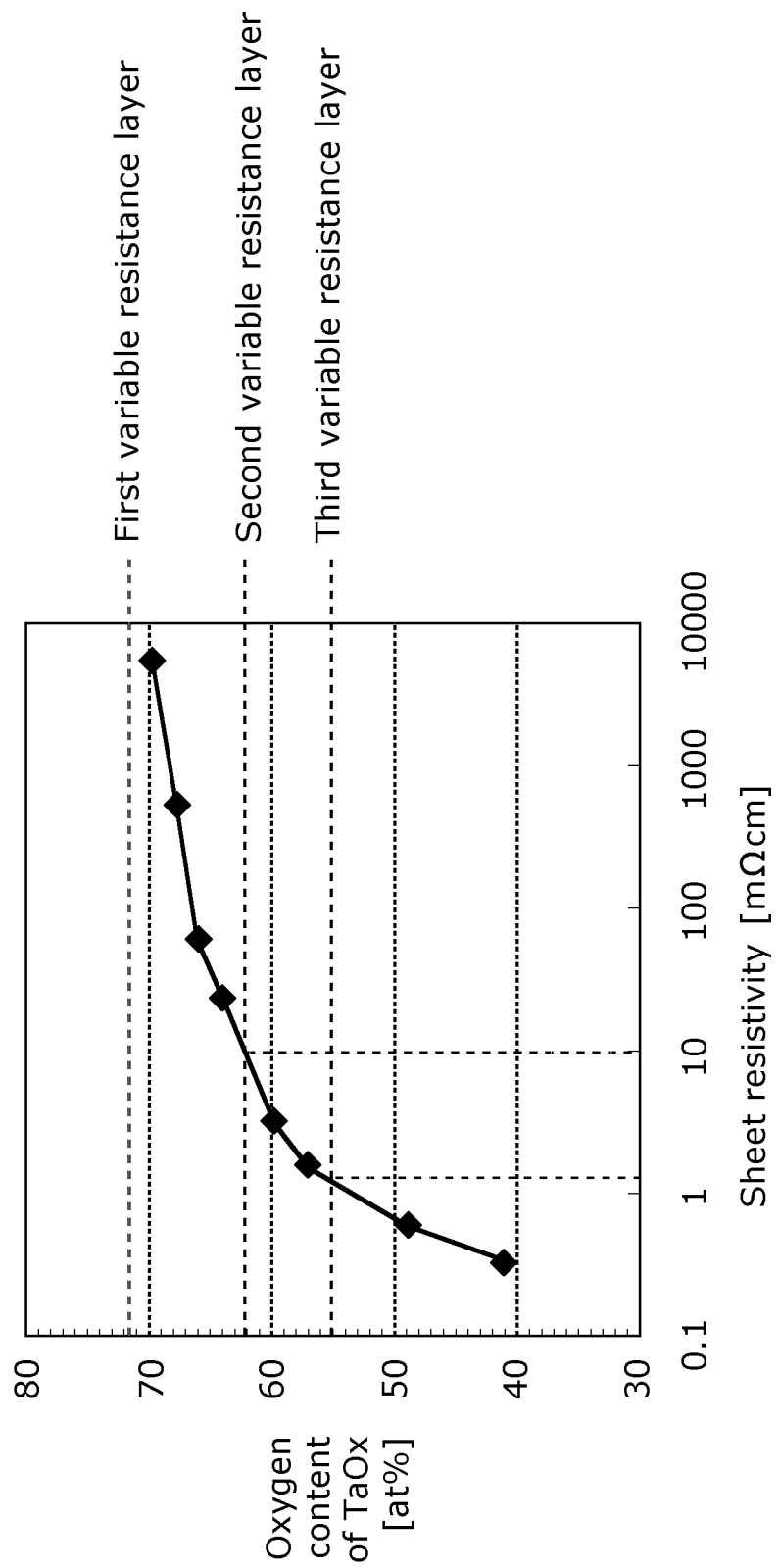

FIG. 9 is a graph showing a relationship between a sheet resistivity and an oxygen content atomic percentage of a variable resistance layer comprising a tantalum oxide and included in the nonvolatile storage element.

Figure 10:
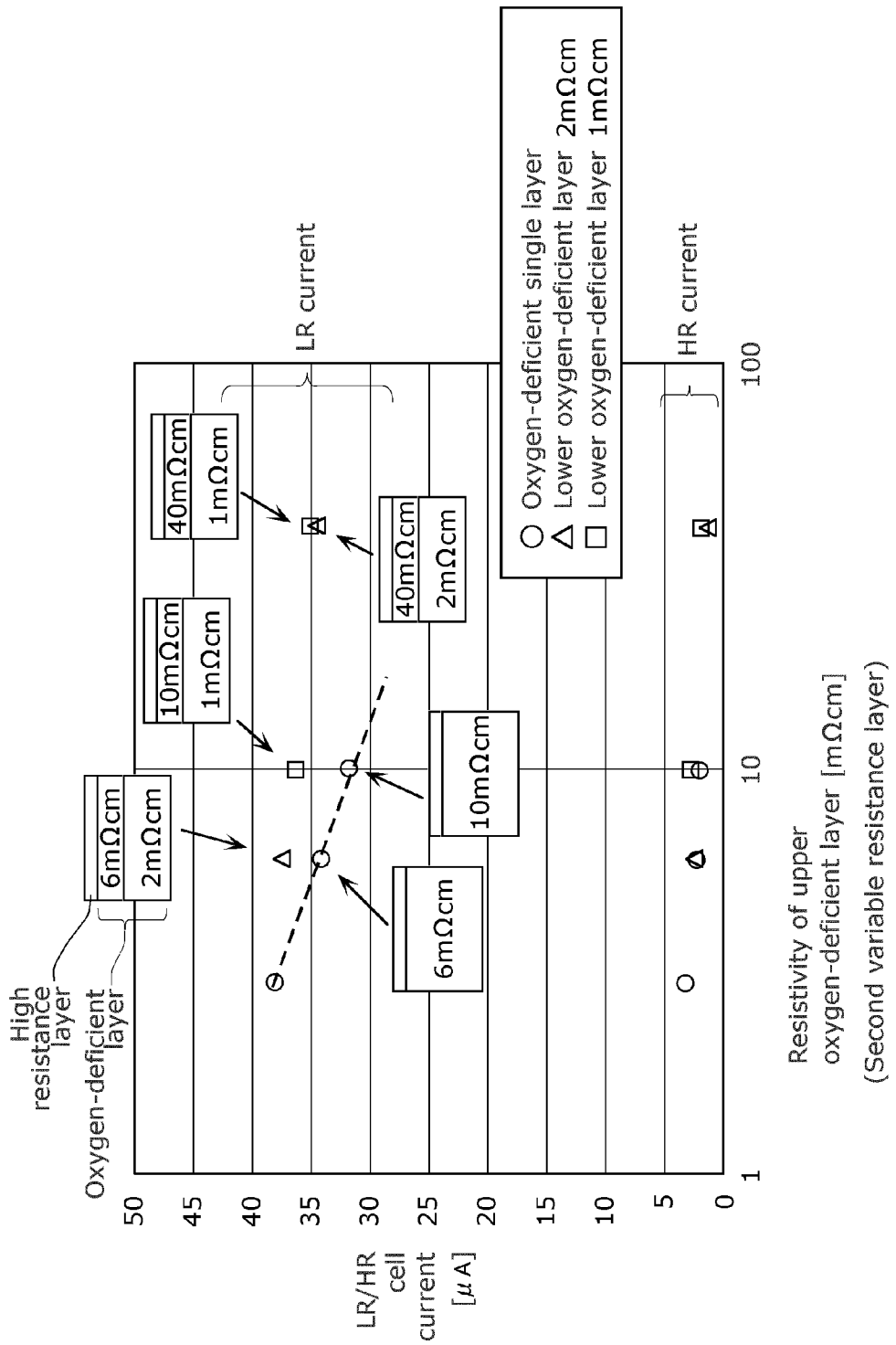

FIG. 10 is a graph showing a relationship between a cell current and a structure of the variable resistance layer of the nonvolatile storage element.

Figure 11:
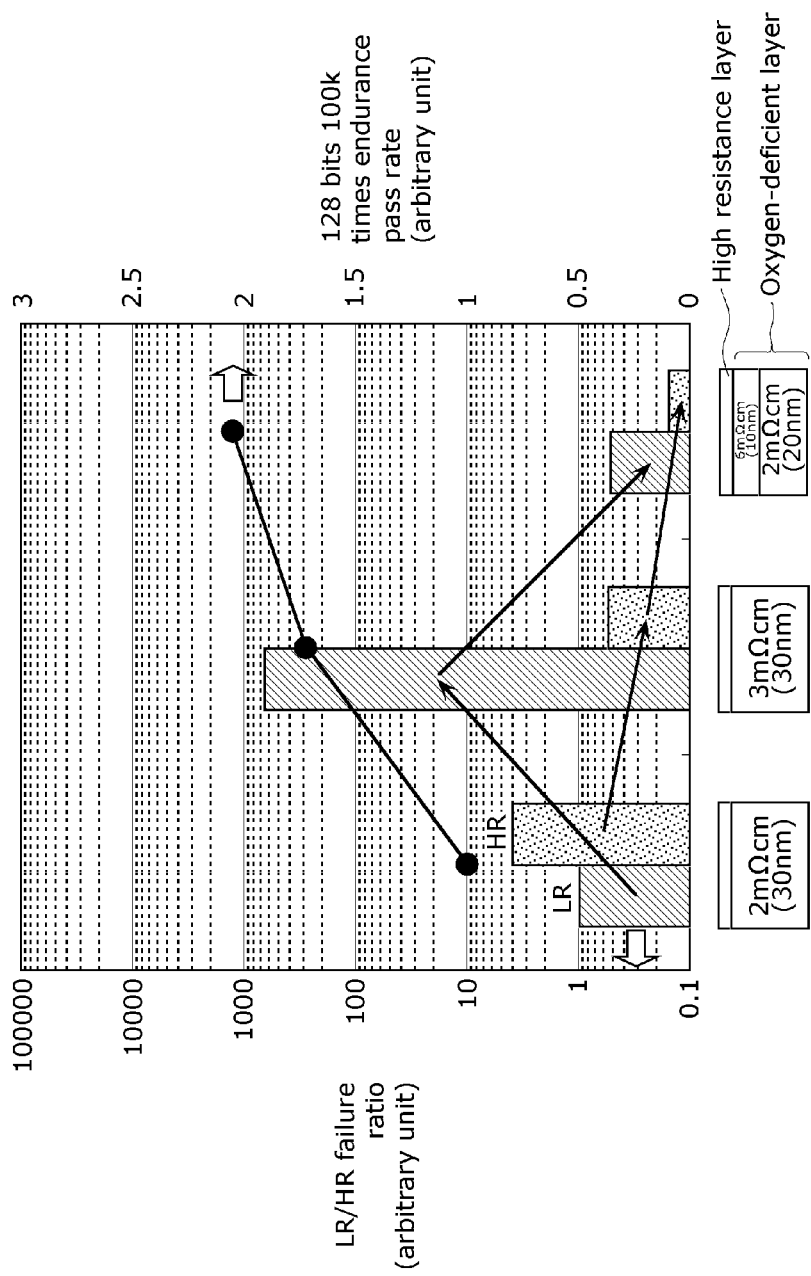

FIG. 11 is a graph showing a relationship between endurance characteristics and a structure of the variable resistance layer of the nonvolatile storage element.

Figure 12:
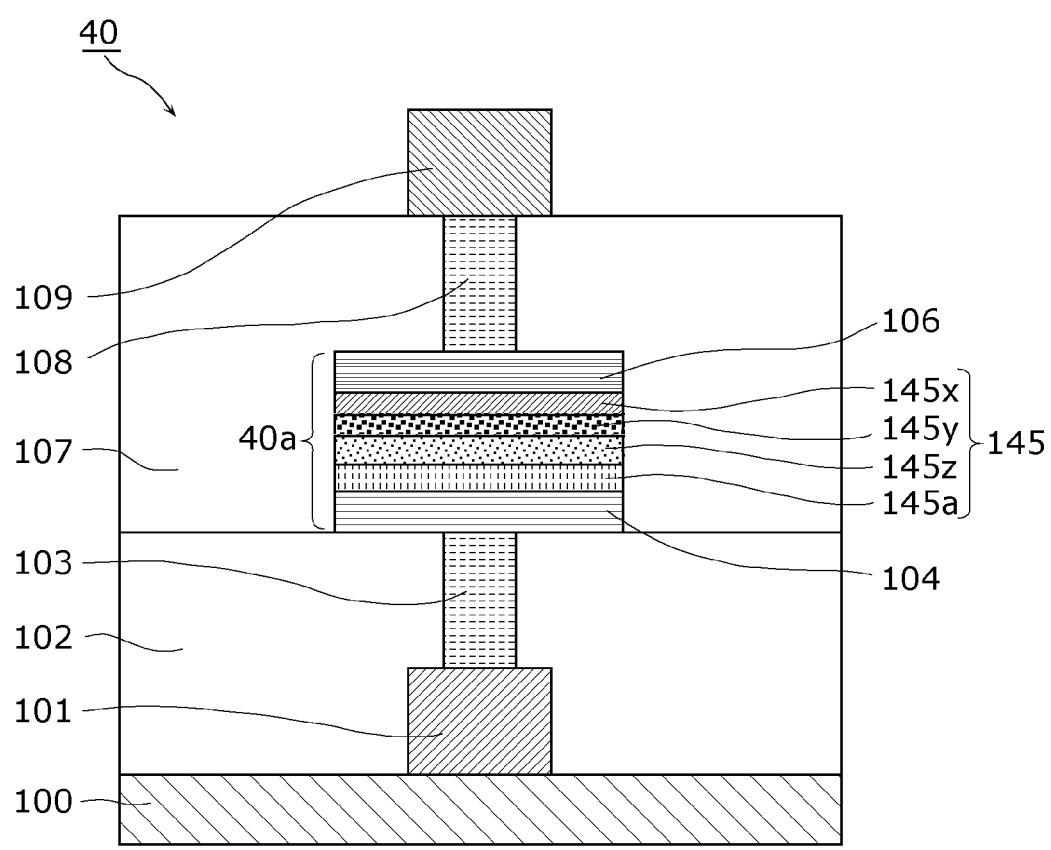

FIG. 12 is a cross-sectional view showing an exemplary structure of a nonvolatile storage element according to Embodiment 4 of the present invention.

Figure 13:
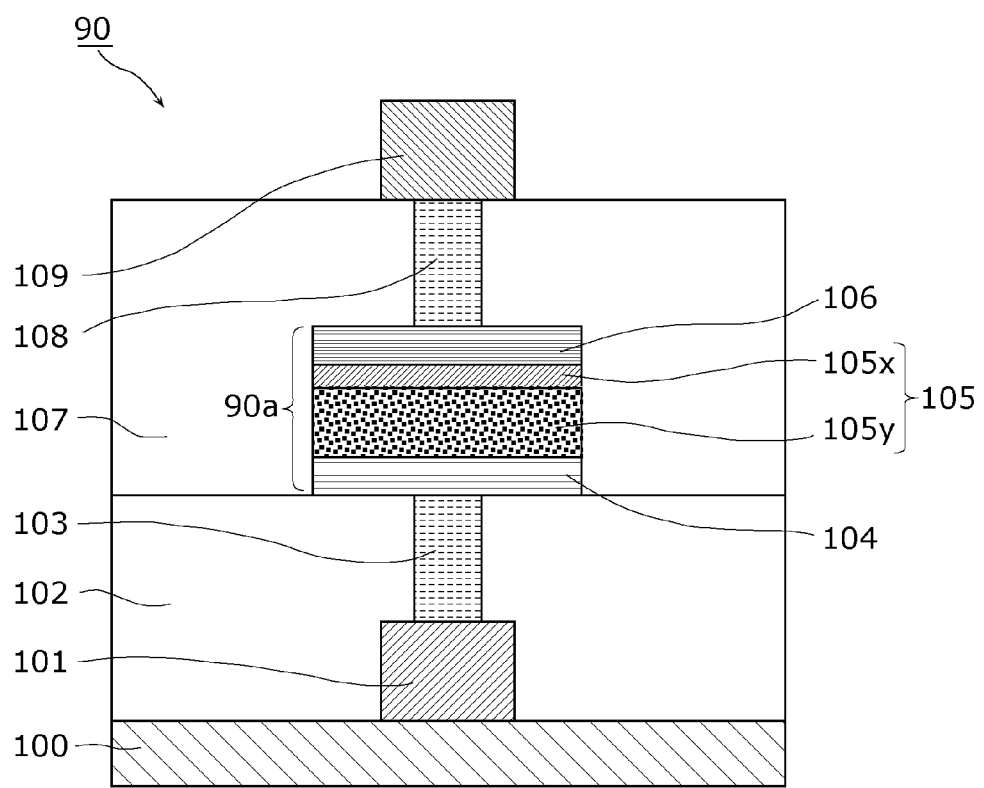

FIG. 13 is a cross-sectional view showing an exemplary structure of a conventional nonvolatile storage element.

Figure 14:
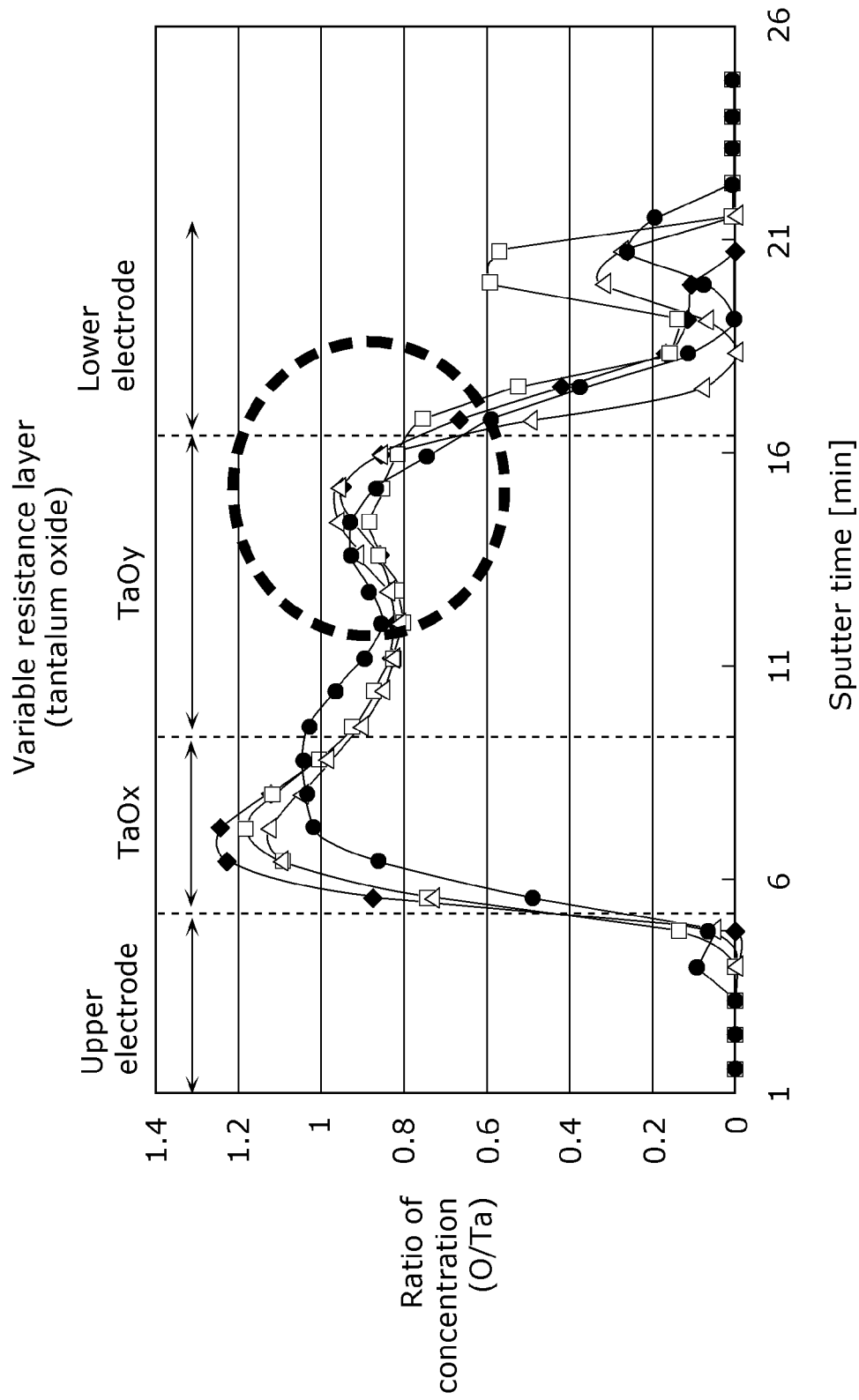

FIG. 14 is a graph showing an oxygen profile in a variable resistance layer comprising TaO of the conventional nonvolatile storage element.

Figure 15A:
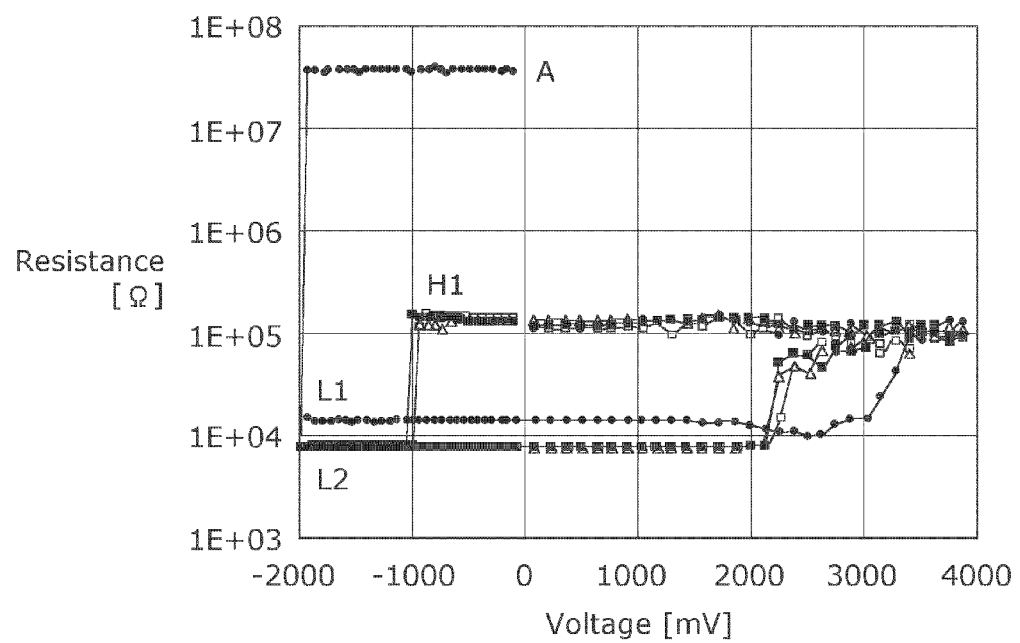

FIG. 15A is a graph showing resistance-voltage characteristics of the conventional nonvolatile storage element.

Figure 15B:
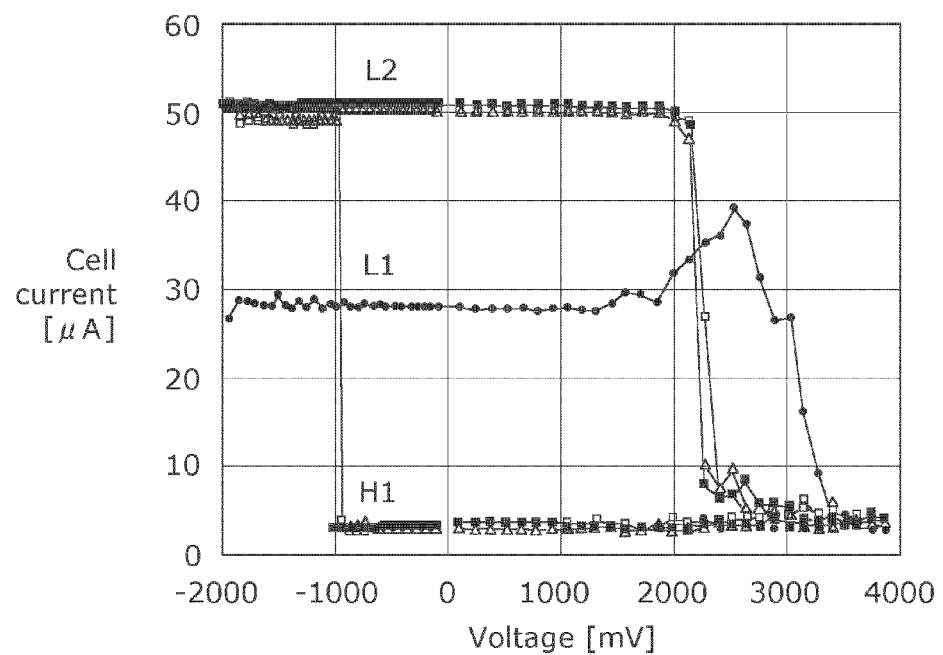

FIG. 15B is a graph showing current-voltage characteristics of the conventional nonvolatile storage element.

Figure 16:
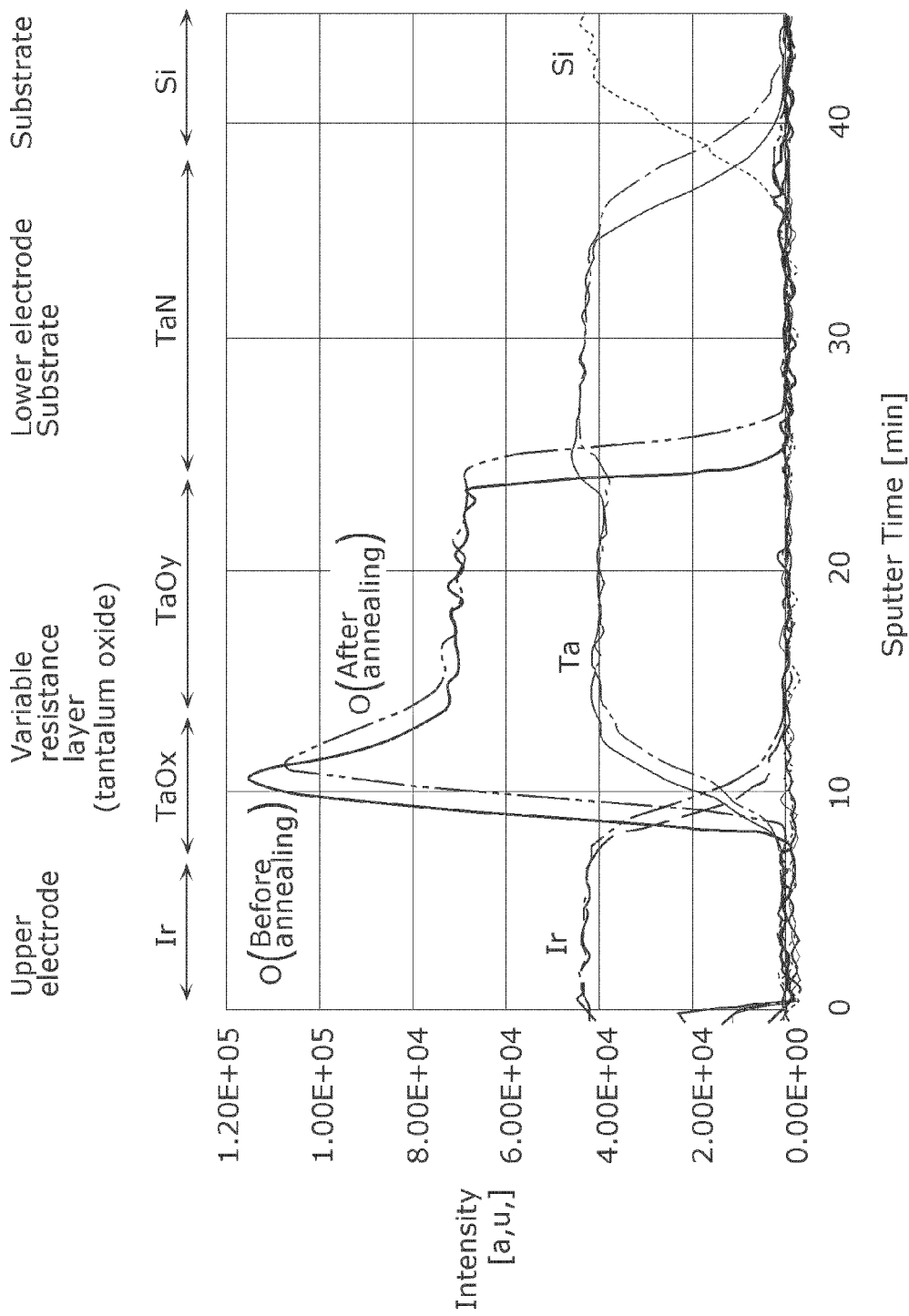

FIG. 16 is a graph showing pre-annealing and post-annealing oxygen profiles in the variable resistance layer comprising TaO of the conventional nonvolatile storage element.

FIG. 17A is a distribution chart of a resistance change start voltage (low resistance writing) before operations of writing to cause resistance change are performed on the conventional nonvolatile storage element.

FIG. 17B is a distribution chart of a resistance change start voltage (low resistance writing) after the operations of writing to cause resistance change are performed on the conventional nonvolatile storage element.

DETAILED DESCRIPTION OF EMBODIMENTS

The following describes a nonvolatile storage element and a method for manufacturing the same according to embodiments of the present invention, with reference to the drawings. It is to be noted that description of constituent elements to which the same reference signs are assigned in the drawings may be omitted. In addition, the drawings schematically show the constituent elements for ease of comprehension, and their shapes or the like are not displayed accurately.

Before the embodiments of the present invention are described, the result of previous studies leading to the conception of the present invention is described below.

First, when a resistance change operation was performed by applying a voltage between the first electrode 106 and the second electrode 104 in the conventionally structured variable resistance element described in Background Art, it was observed that an oxygen concentration increased near an interface between the second electrode 104 and the second transition metal oxide layer 105y. FIG. 14 shows the situation. FIG. 14 is a graph showing an oxygen profile (oxygen concentration profile), obtained using Auger electron spectroscopy (AES), in a depth direction of the variable resistance element 90a including the first electrode 106, the variable resistance layer 105, and the second electrode 104. Here, the variable resistance layer comprises a tantalum oxide. The horizontal axis indicates a sputter time in the AES analytical method, and is equivalent to a distance corresponding to the depth direction of the variable resistance element. The vertical axis indicates a ratio of concentration between tantalum and oxygen, and shows that an oxygen content atomic percentage (ratio) is higher as the value increases. Moreover, the number of data is the number of samples, and FIG. 14 shows a result of four samples (black rhombus, black square, black triangle, and black circle). It is clear from FIG. 14 that the first transition metal oxide layer 105x ($TaO_x$) formed on a side of the first electrode 106 has an oxygen content atomic percentage higher than that of the second transition metal oxide layer 105y ($TaO_y$).

On the other hand, it is possible to identify a peak that oxygen has increased in the second transition metal oxide layer 105y in contact with the interface of the second electrode 104. This is because oxygen is diffused by heat treatment in a post process subsequent to the formation of the variable resistance element 90a, and the oxygen in the second transition metal oxide layer 105y remains near the interface of the second electrode 104. Moreover, it is highly concerned that, even at a stage where the bipolar variable resistance nonvolatile storage element that applies positive and negative pulse voltages is manufactured after the diffusion process, in the bipolar variable resistance nonvolatile storage element, oxygen ions electrically move toward the second electrode 104 and the oxygen in the second transition metal oxide layer 105y increases near the interface of the second electrode 104.

Such an increase in oxygen in the second transition metal oxide layer 105y near the interface of the second electrode 104 causes malfunctions in device operations. The following describes, as an example, an adverse effect of a breakdown process for starting resistance change (a process of forming a filament path, a micro region of which resistance changes substantially, in the first transition metal oxide layer 105x, a high resistance layer, and subsequently enabling a smooth pulse operation).

FIG. 15A is a graph showing resistance-voltage characteristics of the conventional nonvolatile storage element, and FIG. 15B is a graph showing current-voltage characteristics of the same. As stated above, the nonvolatile storage element including the variable resistance layer formed by stacking the transition metal oxides having the different oxygen content atomic percentages is an element of which resistance can change when the filament path, the micro region of which resistance changes, is formed in the first transition metal oxide layer after initial breakdown of the variable resistance layer is performed by applying a voltage to the variable resistance layer. According to FIG. 15A, the nonvolatile storage element has the initial resistance of approximately 70 MΩ (Level A) before the breakdown is performed on the first transition metal oxide layer. As a negative voltage is continuously applied to a side of the first electrode 106, oxygen ions are released from part of the first transition metal oxide layer 105x to reduce an oxygen concentration of the part, the breakdown occurs at approximately −2 V, and the nonvolatile storage element has a LR resistance of approximately 20 kΩ (Level L1). Next, when a positive voltage is applied to the side of the first electrode 106, the resistance of the nonvolatile storage element changes at approximately +3 V, and the nonvolatile storage element has a HR resistance of approximately 200 kΩ (Level H1). As the negative voltage is continuously applied to the side of the first electrode 106 again, the resistance change occurs at approximately −1 V, and the nonvolatile storage element has a LR resistance of approximately 9 kΩ (Level L2). When the positive voltage is further applied to the side of the first electrode 106, the resistance change occurs at approximately +2 V that is lower than the previous voltage, and the nonvolatile storage element has the HR resistance of approximately 200 kΩ (Level H1). Subsequently, the nonvolatile storage element stably changes between the LR resistance of Level L2 and the HR resistance of Level H1. As for the initial breakdown, a difference in oxygen concentration between the first transition metal oxide layer 105$x$ and the second transition metal oxide layer 105$y$ appears as a difference in voltage division, and in the first application of the negative voltage, the voltage is selectively applied to the first transition metal oxide layer (high resistance layer) 105$x$ on the side of the first electrode 106. In contrast, a sufficient voltage is not easily applied to a region where oxygen that is generated by the heat treatment in the post process and is in the second transition metal oxide layer (low resistance layer) near the interface of the second electrode 104 is segregated (piled up), because a resistance value of the region is not as high as that of the first transition metal oxide layer 105$x$. Consequently, it is estimated that the breakdown is performed only on the high resistance layer on the side of the first electrode 106, and the breakdown is not performed on the low resistance layer that is near the interface of the second electrode 104 and includes the region where the oxygen is piled up. For this reason, the nonvolatile storage element cannot reach Level L2 that should have been reached, and remains at Level L1 where the resistance is slightly high. Moreover, it would appear that in a high resistance writing operation, a voltage applied to the first transition metal oxide layer 105$x$ is effectively reduced as a divided voltage is also applied to the region where an oxygen concentration of a neighborhood of the interface between the second transition metal oxide layer 105$y$ and the second electrode 104 is increased, and an operating voltage rises when a positive voltage is first applied. In terms of the current-voltage characteristics in FIG. 15B that are used for determination using an actual sense amplifier, Level L1 is positioned halfway between Level L2 and Level H1, and a readout window is significantly reduced. From the above, reducing the occurrence of a resistance change phenomenon in a neighborhood of an interface opposite to the interface between the first electrode 106 and the first transition metal oxide layer 105$x$ on the side where the resistance change is to be caused, that is, the neighborhood of the interface between the second transition metal oxide layer 105$y$ and the second electrode 104 leads to increase a margin of the readout window, and is highly important for the increase in capacity and the miniaturization.

In addition to the above problem, it became obvious that the heat treatment in the post process subsequent to the formation of the variable resistance element 90$a$ diffused the oxygen from the first transition metal oxide layer 105$x$ to the second transition metal oxide layer 105$y$, and deteriorated an oxygen profile in a voltage application direction. FIG. 16 shows the situation. Like FIG. 14, FIG. 16 is a graph showing a result of the AES performed on an oxygen profile in the depth direction of the variable resistance element 90$a$ including the first electrode 106, the variable resistance layer 105, and the second electrode 104. To facilitate comprehension of a state before and after the heat treatment, the oxygen profile after the heat treatment is intentionally shifted to the right, and the oxygen profile before the heat treatment and the oxygen profile after the heat treatment are shown by a solid line and a broken line, respectively. Here, the heat treatment is performed at 400° C. for 10 minutes. It is clear from FIG. 16 that the heat treatment decreases an oxygen concentration of the first transition metal oxide layer 105$x$, and increases an oxygen concentration of an upper portion of the second transition metal oxide layer 105$y$. This suggests that the heat treatment diffuses the oxygen from the first transition metal oxide layer 105$x$ having a high oxygen concentration to the second transition metal oxide layer 105$y$ having a low oxygen concentration.

In general, when a voltage necessary for writing to cause resistance change is applied between the first electrode 106 and the second electrode 104 of the variable resistance element 90$a$, the voltage is divided into a voltage applied to the first transition metal oxide layer 105$x$ and a voltage applied to the second transition metal oxide layer 105$y$. The first transition metal oxide layer 105$x$ having the high oxygen concentration has a resistivity higher than that of the second transition metal oxide layer 105$y$ having the low oxygen concentration, and thus the applied voltage is divided more to the first transition metal oxide layer 105$x$. When the oxygen profile of the variable resistance element 90$a$ deteriorates, the oxygen concentration of the first transition metal oxide layer 105$x$ decreases, and the oxygen concentration of the second transition metal oxide layer 105$y$ increases. This decreases the voltage applied to the first transition metal oxide layer 105$x$, and increases the voltage applied to the second transition metal oxide layer 105$y$, thereby changing a voltage balance. A degree of deterioration of an oxygen profile varies for each bit, and thus a state where the applied voltage is divided to the first transition metal oxide layer 105$x$ and the second transition metal oxide layer 105$y$ differs for each bit, which is considered as one of causes for a variation in resistance change characteristics.

Each of FIG. 17A and FIG. 17B is a graph showing a distribution of an applied voltage necessary for changing the conventional nonvolatile storage element to a low resistance state (a low resistance writing start voltage). The horizontal axis indicates a low resistance writing start voltage VLs, and the vertical axis indicates the number of bits. FIG. 17A shows a distribution of a low resistance writing start voltage at the initial state, and FIG. 17B shows a distribution of a low resistance writing start voltage after an operation of writing to cause resistance change is performed half a million times. First, it is clear from FIG. 17A that the center of the low resistance writing start voltage is −1.5V (applied to the first electrode 106 with respect to the second electrode 104), and that the low resistance writing start voltage varies within a range of ±0.3 V with reference to −1.5V. This is revealed as a variation in a resistance change start voltage, because the degree of deterioration of the oxygen profile differs for each bit and the oxygen profile varies for each bit as stated above. Moreover, it is clear from FIG. 17B that the variation in the low resistance writing start voltage deteriorates after the operation of writing to cause resistance change is performed half a million times, and the low resistance writing start voltage significantly varies in a direction in which an absolute value is higher than −1.5 V. In the operation of writing to cause resistance change, −1.8 V is applied at the time of low resistance writing, and +2.4 V is applied at the time of high resistance writing. The resistance change operation is oxidation and reduction reaction, and thus the oxygen moves as negatively-charged oxygen ions. At the time of the low resistance writing, oxygen in a filament formed in the first transition metal oxide layer 105$x$ is released from the neighborhood of the interface between the filament and the first electrode 106, and thus a positive voltage is applied to the second electrode 104 with respect to the first electrode 106. In contrast, at the time of the high resistance writing, the oxygen is segregated at the neighborhood of the interface between the filament formed in the first transition metal oxide layer 105x and the first electrode 106, and thus a negative voltage is applied to the second electrode 104 with respect to the first electrode 106. Moreover, when the low resistance writing is performed, a highly-concentrated oxygen layer (high resistance layer) comprising a transition metal oxide is formed at the neighborhood of the interface between the filament and the first electrode 106. Consequently, the high resistance layer is likely to be applied with a voltage, and an absolute value of the voltage applied to the entire variable resistance layer becomes smaller. When the above operation is repeated, an absolute value of a high resistance writing voltage is different from that of a low resistance writing voltage. As a result, in the entire variable resistance layer, an electric field that causes the oxygen to move away from the first electrode 106 is more powerful than an electric field that causes the oxygen to move toward the first electrode 106. For this reason, the variable resistance layer is more likely to change to a high resistance state, and it is thus considered that the low resistance writing start voltage varies more in a direction of a higher voltage as the absolute value of the low resistance writing start voltage. As above, the resistance change operation is the oxidation-reduction reaction accompanying the movement of the oxygen ions, and has a close relationship with the oxygen profile. Therefore, it turns out that to reduce the variation for each bit, a structure in which the oxygen profile does not deteriorate easily is needed.

The present invention is intended to reduce an occurrence of the nonvolatile storage element malfunctioning, and significantly decrease its probability, based on the above-mentioned knowledge newly discovered by the inventors. In addition, the present invention is intended to reduce an occurrence of deterioration of an oxygen profile in the nonvolatile storage element, and decrease a variation in resistance change characteristics of each bit.

The following describes embodiments of the present invention in detail.

Embodiment 1

Figure 1:
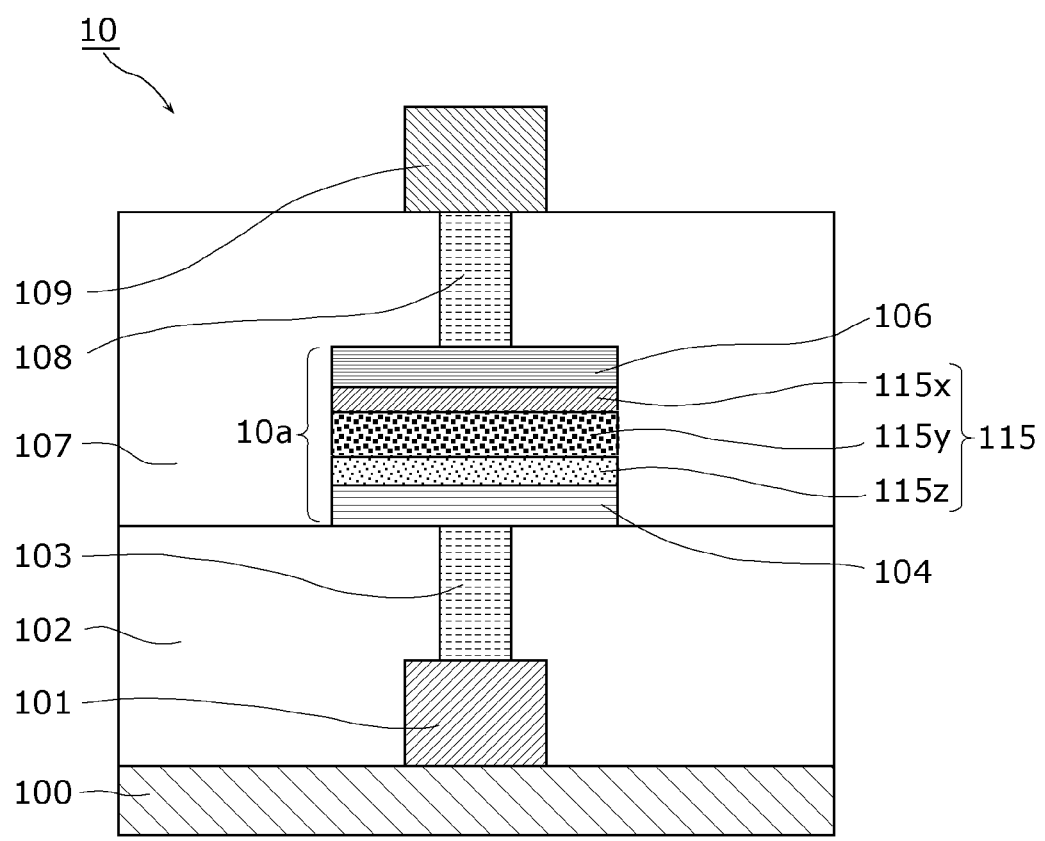
FIG. 1 is a cross-sectional view showing an exemplary structure of a nonvolatile storage element according to Embodiment 1 of the present invention.

FIG. 1 is a cross-sectional view showing an exemplary structure of a variable resistance nonvolatile storage element 10 according to Embodiment 1 of the present invention. As shown in FIG. 1, the nonvolatile storage element 10 according to Embodiment 1 includes: a substrate on which a first line 101 is formed; a first interlayer insulating layer 102 that is formed on the substrate 100 to cover the first line 101 and includes a silicon oxide film (a film thickness of 300 to 500 nm); and a first contact plug 103 (a diameter of 50 to 300 nm) that is formed to penetrate the first interlayer insulating layer 102, is electrically connected to the first line 101, and is made of tungsten as a main component. Moreover, a variable resistance element 10a that includes a second electrode (a lower electrode in this embodiment) 104 (a film thickness of 5 to 100 nm), a variable resistance layer 115 (a film thickness of 20 to 100 nm), and a first electrode (an upper electrode in this embodiment) 106 (a film thickness of 5 to 100 nm) is formed on the first interlayer insulating layer 102 to cover the first contact plug 103. A second interlayer insulating layer 107 that includes a silicon oxide film (a film thickness of 300 to 500 nm) is formed to cover the variable resistance element 10a, and a second contact plug 108 (a diameter of 50 to 300 nm) that is electrically connected to the first electrode 106 and made of tungsten as a main component is formed to penetrate the second interlayer insulating layer 107. A second line 109 is formed on the second interlayer insulating layer 107 to cover the second contact plug 108.

Here, the variable resistance layer is a layer that is provided between the first electrode 106 and the second electrode 104 and in which a resistance value reversibly changes based on electrical signals provided between the electrodes, and has a structure formed by stacking a first transition metal oxide layer 115x having a composition expressed as $MO_x$ (M represents transition metal, and O represents oxygen), a second transition metal oxide layer 115y having a composition expressed as $MO_y$ (where x>y), and a third transition metal oxide layer 115z having a composition expressed as $MO_z$ (where y>z) in this order.

In other words, the first transition metal oxide layer 115x is provided to be in contact with the first electrode 106, and the third transition metal oxide layer 115z is provided to be in contact with the second electrode 104. These transition metal oxide layers comprise transition metal oxides of the same type. The transition metal oxide comprised in the first transition metal oxide layer 115x has an oxygen content atomic percentage higher than that of the transition metal oxide comprised in the second transition metal oxide layer 115y, and the transition metal oxide comprised in the third transition metal oxide layer 115z has an oxygen content atomic percentage lower than that of the transition metal oxide comprised in the second transition metal oxide layer 115y.

In this embodiment, an oxygen content atomic percentage when a variable resistance layer (a transition metal oxide layer) comprises a tantalum oxide is examined. The Applicants have reported that, in PTL 2 (International Publication WO 2008/059701), in the case where a single variable resistance layer comprises an oxygen-deficient tantalum oxide indicating an oxygen-deficient state, a stable operation in which a high resistance value is five or more times a low resistance value is possible when its oxygen content atomic percentage is in a range of not less than 0.8 and not more than 1.9. Moreover, the Applicants have reported that, in PTL 1 recited in Citation List, forming a stack structure by inserting, near an interface of an electrode, a tantalum oxide having an oxygen content atomic percentage greater than or equal to 2.1 eliminates the need for a forming operation, and achieves a stable pulse operation for the first application of a voltage.

In view of the above, for instance, the first transition metal oxide layer comprising $TaO_x$ has an oxygen range of 2.1≤x that makes it possible to selectively facilitate the oxidation and the reduction reaction that eliminate the need for the forming operation, the second transition metal oxide layer comprising $TaO_y$ has an oxygen range of 0.8≤y≤1.9 that allows a stable resistance change therein as a body, and the third transition metal oxide layer comprising $TaO_z$ has an oxygen range of z<0.8 that does not easily allow resistance change due to a low oxygen content atomic percentage. Furthermore, for example, the first transition metal oxide layer comprising $TaO_x$ has a film thickness of not less than 1 nm and not more than 8 nm.

Moreover, in this embodiment, an oxygen content atomic percentage when a variable resistance layer comprises a hafnium oxide is examined. The Applicants have also reported in a previous patent application (PTL 3: International Publication WO 2010/004705) that in the case where a single variable resistance layer comprises a hafnium oxide indicating an oxygen-deficient state, resistance change occurs when its oxygen content atomic percentage is in a range of not less than 0.9 and not more than 1.6. The Applicants have also reported that forming a stack structure by inserting, in an interface of an electrode, a hafnium oxide having a range of greater than 1.8 eliminates the need for a forming operation, and achieves a stable pulse operation for the first application of a voltage.

In view of the above, for instance, the first transition metal oxide layer comprising $HfO_x$ has a composition range of $1.8<x$ that makes it possible to selectively facilitate the oxidation and the reduction reaction that eliminate the need for the forming operation, the second transition metal oxide layer comprising $HfO_y$ has a composition range of $0.9 \leq y \leq 1.6$ that allows a stable resistance change therein as a parent body, and the third transition metal oxide layer comprising $HfO_z$ has a composition range of $z<0.9$ that does not easily allow resistance change due to a low oxygen content atomic percentage. Furthermore, for example, the first transition metal oxide layer comprising $HfO_x$ has a film thickness of not less than 3 nm and not more than 4 nm.

Moreover, in this embodiment, an oxygen content atomic percentage when a variable resistance layer comprises a zirconium oxide is examined. The Applicants have reported in a previous patent application (PTL 4: Japanese Unexamined Patent Application Publication No. 2010-21381) that in the case where a single variable resistance layer comprises a zirconium oxide indicating an oxygen-deficient state, resistance change occurs when its oxygen content atomic percentage is in a range of not less than 0.9 and not more than 1.4. The Applicants have also reported that forming a stack structure by inserting, in an interface of an electrode, a zirconium oxide having a range of greater than 1.9 and less than 2.0 eliminates the need for a forming operation, and achieves a stable pulse operation for the first application of a voltage.

In view of the above, for instance, the first transition metal oxide layer comprising $ZrO_x$ has a composition range of $1.9<x$ that makes it possible to selectively facilitate the oxidation and the reduction reaction that eliminate the need for the forming operation, the second transition metal oxide layer comprising $ZrO_y$ has a composition range of $0.9 \leq y \leq 1.4$ that allows a stable resistance change therein as a parent body, and the third transition metal oxide layer comprising $ZrO_z$ has a composition range of $z<0.9$ that does not easily allow resistance change due to a low oxygen content atomic percentage. Furthermore, for example, the first transition metal oxide layer comprising $ZrO_x$ has a film thickness of not less than 1 nm and not more than 5 nm.

As stated, in this embodiment, the variable resistance layer 115 includes the first transition metal oxide layer 115x having the high oxygen concentration, the second transition metal oxide layer 115y having the low oxygen concentration, and the third transition metal oxide layer 115z having the ultralow oxygen concentration.

Each of FIGS. 2A to 2F is a cross-sectional view showing a method for manufacturing the principal part of the variable resistance nonvolatile storage element 10 according to Embodiment 1. The following describes the method for manufacturing the principal part of the variable resistance nonvolatile storage element 10 according to Embodiment 1, with reference to the figures.

Figure 2A:
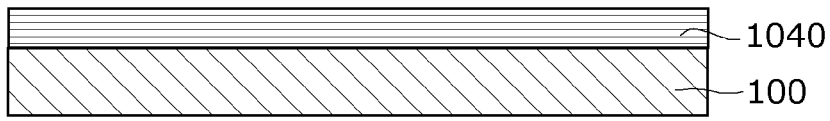
FIG. 2A is a cross-sectional view showing a method for manufacturing the principal part of the nonvolatile storage element according to Embodiment 1 of the present invention.

As shown in FIG. 2A, to form the second electrode 104, a conductive layer 1040 that is to be the second electrode (lower electrode) 104 after patterning and comprises a tantalum nitride is formed on the substrate 100 on which a transistor, a lower-layer line, and so on are formed.

Figure 2B:
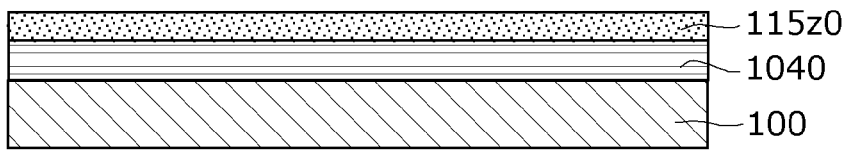
FIG. 2B is a cross-sectional view subsequent to FIG. 2A and showing the method for manufacturing the principal part of the nonvolatile storage element according to Embodiment 1 of the present invention.

Next, as shown in FIG. 2B, to form the third transition metal oxide layer 115z, a third transition metal oxide layer 115z0 that comprises a transition metal oxide having the lowest oxygen content atomic percentage is formed on the conductive layer 1040. Here, the third transition metal oxide layer 115z0 is formed by sputtering a tantalum target in a mixed gas atmosphere of argon and oxygen, that is, the so-called reactive sputtering (power: 1600 W, film formation pressure: 0.16 Pa, gas flow rate: $Ar/O_2$=43/12 sccm). When a tantalum oxide layer as the third transition metal oxide layer is expressed as $TaO_z$, its oxygen content atomic percentage, resistivity, and film thickness are z=0.68, 0.33 mΩcm, and 10 nm, respectively.

Figure 2C:
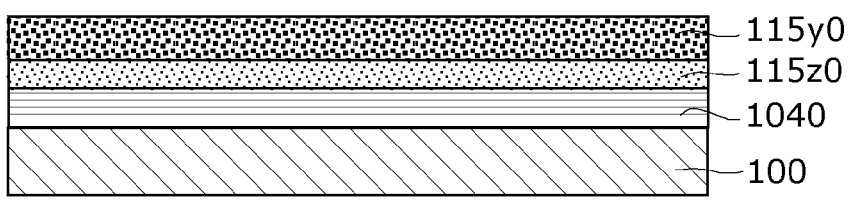
FIG. 2C is a cross-sectional view subsequent to FIG. 2B and showing the method for manufacturing the principal part of the nonvolatile storage element according to Embodiment 1 of the present invention.

Next, as shown in FIG. 2C, to form the second transition metal oxide layer 115y, a second transition metal oxide layer 115y0 that comprises a transition metal oxide is formed on the third transition metal oxide layer 115z0. Here, the second transition metal oxide layer 115y0 is similarly formed by the reactive sputtering for sputtering a tantalum target in an oxygen gas atmosphere (power: 1600 W, film formation pressure: 0.16 Pa, gas flow rate: $Ar/O_2$=34.7/20.3 sccm). When a tantalum oxide layer as the second transition metal oxide layer is expressed as $TaO_y$, its oxygen content atomic percentage, resistivity, and film thickness are y=1.29, 6 mΩcm, and 35 nm, respectively.

Figure 2D:
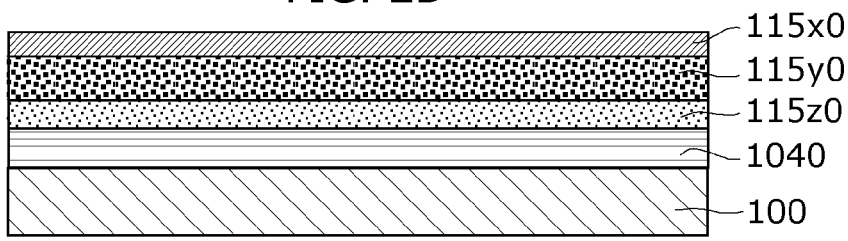
FIG. 2D is a cross-sectional view subsequent to FIG. 2C and showing the method for manufacturing the principal part of the nonvolatile storage element according to Embodiment 1 of the present invention.

Next, as shown in FIG. 2D, to form the first transition metal oxide layer 115x, a first transition metal oxide layer 115x0 that comprises a transition metal oxide having the highest oxygen content atomic percentage is formed on the second transition metal oxide layer 115y0. Here, the first transition metal oxide layer 115x0 is similarly formed by the reactive sputtering for sputtering a tantalum target in an oxygen gas atmosphere (power: 1600 W, film formation pressure: 0.16 Pa, gas flow rate: $Ar/O_2$=30/25 sccm). When a tantalum oxide layer as the first transition metal oxide layer is expressed as $TaO_x$, its oxygen content atomic percentage, resistivity, and film thickness are x=2.4, greater than or equal to $10^7$ mΩcm (i.e., a resistivity of an insulating layer), and 5 nm, respectively. To put it another way, regarding the film thicknesses of the three transition metal oxide layers, the second transition metal oxide layer 115y has a film thickness greater than those of the first transition metal oxide layer 115x and the third transition metal oxide layer 115z.

It is to be noted that although the layers are formed by the reactive sputtering above, the transition metal oxide layer having the highest oxygen content atomic percentage may be formed by plasma oxidation of a surface layer. The sputtering usually has difficulty including more oxygen than defined by a stoichiometric composition (in the case of the tantalum oxide, x=2.5), but the plasma oxidation injects oxygen into grain boundaries, faults, or the like of the tantalum oxide, thereby making it possible to form a transition metal oxide layer having a higher oxygen content atomic percentage. As a result, the plasma oxidation is effective in reducing a leak current. For instance, it is possible to form a transition metal oxide layer that comprises tantalum having x=2.4 and a film thickness of approximately 5 nm, by processing at a film formation temperature of 300° C. and a power of 200 W for 15 seconds. Moreover, the reactive sputtering for sputtering a tantalum oxide target in an oxygen gas atmosphere may be used.

Figure 2E:
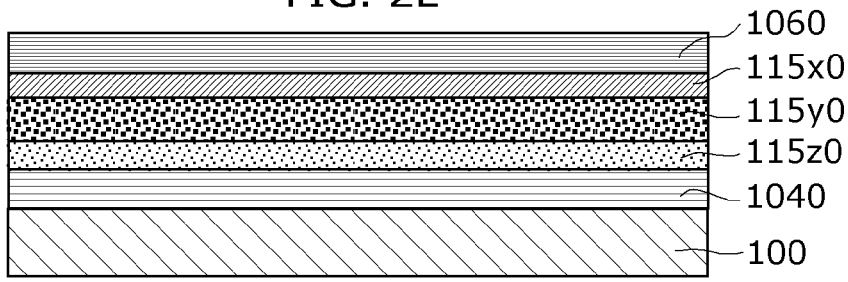
FIG. 2E is a cross-sectional view subsequent to FIG. 2D and showing the method for manufacturing the principal part of the nonvolatile storage element according to Embodiment 1 of the present invention.

Next, as shown in FIG. 2E, to form the first electrode (upper electrode) 106, a conductive layer 1060 that is to be the first electrode 106 after patterning and comprises platinum is formed on the first transition metal oxide layer 115x0.

Figure 2F:
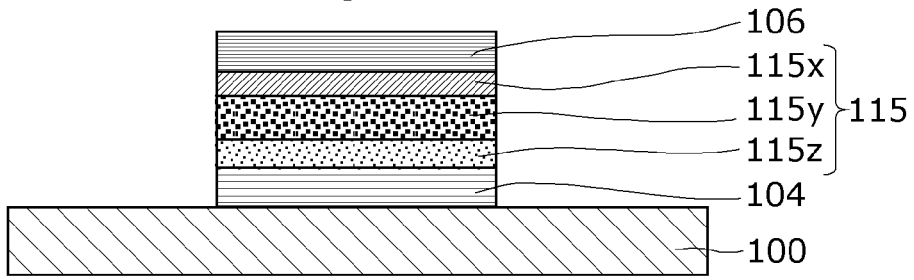
FIG. 2F is a cross-sectional view subsequent to FIG. 2E and showing the method for manufacturing the principal part of the nonvolatile storage element according to Embodiment 1 of the present invention.

Finally, as shown in FIG. 2F, to form the variable resistance element 10a, the conductive layer 1040, the third transition metal oxide layer 115z0, the second transition metal oxide layer 115y0, the first transition metal oxide layer 115x0, and the conductive layer 1060 are patterned using a desired mask. The formed variable resistance element 10a includes, between the second electrode 104 and the first electrode 106, the variable resistance layer 115 having a three-layer stack structure of the third transition metal oxide layer 115z, the second transition metal oxide layer 115y, and the first transition metal oxide layer 115x. It is difficult to etch, for instance, a precious metal represented as a material having a high standard electrode potential. Thus, when the first electrode is made of the precious metal, it is also possible to form the variable resistance element 10a using the precious metal as a hard mask. Although the patterning is collectively performed using the same mask in this step, patterning may be performed for each step.

The above manufacturing method makes it possible to form the transition metal oxides having different oxygen content atomic percentages according to oxygen flow rates, and differentiate the first, second, and third transition metal oxides. Stated differently, it is possible to manufacture the nonvolatile storage element that selectively causes the oxidation and the reduction reaction of the first transition metal oxide in the region near the interface of the first electrode, to always stabilize a polarity of resistance change, and at the same time reduces the occurrence of the resistance change operation (malfunction) of the third transition metal oxide in the region near the interface of the second electrode, to achieve stable memory characteristics.

It is to be noted that a step of oxidizing the first transition metal oxide layer 115x may be further added to the above method for manufacturing the nonvolatile storage element 10. For instance, the first transition metal oxide layer 115x may be oxidized immediately after the first transition metal oxide layer 115x0 is formed or the first transition metal oxide layer 115x is formed by patterning. With this, it is possible to further increase the oxygen content atomic percentage of the first transition metal oxide layer 115x, and produce an effect of reducing the leak current. In addition, it is possible to reduce the influence of the oxygen diffusion caused by the heat treatment in the post process, and more surely cause the oxidation and the reduction reaction of the first transition metal oxide near the interface of the first electrode.

Although the first electrode 106 and the first transition metal oxide layer 115x are connected to each other and the second electrode 104 and the third transition metal oxide layer 115z are connected to each other in this embodiment, in this case, for example, the first and second electrodes are made of materials having different elements as main components, and a standard electrode potential V1 of the first electrode, a standard electrode potential V2 of the second electrode, and a standard electrode potential Vt of a transition metal M comprised in the first, second and third transition metal oxide layers satisfy Vt<V1 and V2<V1. In this embodiment, the first electrode 106 and the first transition metal oxide layer 115x are connected to each other, the second electrode 104 and the third transition metal oxide layer 115z are connected to each other, the first electrode 106 is made of platinum (Pt), and the second electrode 104 is made of a tantalum nitride (TaN). The platinum has a standard electrode potential V1=1.188 V, and the tantalum nitride has a standard electrode potential V2=0.48 V. A standard electrode potential of the tantalum oxide comprised in the variable resistance layer on this occasion that indicates ease of oxidization and reduction of the tantalum is Vt=−0.6 V, and thus Vt<V1, and V2<V1 is further satisfied. By satisfying the above relationships between the standard electrode potentials (Vt<V1 and V2<V1), it is much easier to fix a region of which resistance changes to the interface between the first electrode and the first transition metal oxide layer 115x, and to reduce the occurrence of the malfunction at the interface between the second electrode 104 and the third transition metal oxide layer 115z.

Moreover, since the hafnium in the hafnium oxide has a standard electrode potential Vt=−1.55 V and the zirconium in the zirconium oxide has a standard electrode potential Vt=−1.543 V, Vt<V1 and further V 2<V1 are satisfied even when the variable resistance layer comprises the hafnium oxide or the zirconium oxide.

From the above, the oxidation and the reduction reaction surely occur between the first electrode 106 made of the platinum and the first transition metal oxide layer 115x having the high oxygen content atomic percentage, and the resistance change phenomenon results. Moreover, as V1>V2 is satisfied, the oxidation and the reduction reaction preferentially occur in the interface between the first electrode 106 made of the platinum and the first transition metal oxide layer 115x, and oxidation and reduction reaction do not occur in the interface between the second electrode 104 and the third transition metal oxide layer 115z having the low oxygen content atomic percentage. Consequently, it is possible to prevent the malfunction accompanied by the resistance change phenomenon. The first electrode may be made of one of metals among iridium (Ir: a standard electrode potential=1.156 V), palladium (Pd: a standard electrode potential=0.951 V), and copper (Cu: a standard electrode potential=0.521 V), a combination of any of the metals, or an alloy of any of the metals, in addition to the platinum. The second electrode may be made of one of metals among titanium nitride (TiN: a standard electrode potential=0.55 V), tungsten (W: a standard electrode potential=−0.12 V), and titanium (Ti: a standard electrode potential=−1.63 V), in addition to the tantalum nitride (TaN). In other words, each of the electrodes may be made of one of the above candidates that satisfy V1>V2 and Vt<V1 in terms of a standard electrode potential.

Each of (a) to (c) in FIG. 3 is a graph showing an oxygen profile in a variable resistance layer comprising a tantalum oxide and included in a nonvolatile storage element. (a) in FIG. 3 shows an oxygen profile in a variable resistance layer that is formed by stacking the first transition metal oxide layer comprising $TaO_x$ and the second transition metal oxide layer comprising $TaO_y$ and is included in the conventional nonvolatile storage element. Each of (b) and (c) in FIG. 3 shows an oxygen profile in a variable resistance layer that is formed by stacking the first transition metal oxide layer comprising $TaO_x$, the second transition metal oxide layer comprising $TaO_y$, and the third transition metal oxide layer comprising $TaO_z$ and is included in the nonvolatile storage element 10 according to this embodiment. In FIG. 3, each of the variable resistance layers has a total film thickness of 50 nm, and each of sections indicated by broken lines in the horizontal axis direction corresponds to 10 nm. The third transition metal oxide layer comprising $TaO_z$ has a film thickness of 0 nm in (a) in FIG. 3, a film thickness of 10 nm in (b) in FIG. 3, and a film thickness of 20 nm in (c) in FIG. 3. Although accuracy of resolution in an interface region is not high due to the AES, it is clear from (b) and (c) in FIG. 3 that the presence of the third transition metal oxide layer comprising $TaO_z$ is surely confirmed, and that the transition metal oxide layer can be formed by the reactive sputtering for which an oxygen flow rate is controlled.

FIG. 4 is a graph showing a state of resistance change when voltage pulses of −2.0 V (a low resistance writing voltage) and +4.0 V (a high resistance writing voltage) are applied to the first electrode 106 with respect to the second electrode 104 in the variable resistance element 10a according to this embodiment formed based on the process flow shown in FIGS. 2A to 2F. The vertical axis indicates a resistance value of the variable resistance element 10a, and the horizontal axis indicates an applied pulse count. It is clear from FIG. 4 that even when a pulse is applied to the first electrode more than 900 times, the resistance of the variable resistance layer near the first electrode stably changes by approximately one decade.

Finally, FIGS. 5A to 5C show results of experimentally comparing and verifying the resistance change characteristics in the neighborhood of the interface of the second electrode 104, between the conventional structure and the variable resistance layer that is near the interface (on a side where resistance change is not desired) and is included in the nonvolatile storage element 10 according to this embodiment. In both the conventional structure and the variable resistance layer, the first transition metal oxide layer comprising $TaO_x$ is not intentionally formed so as to reduce the occurrence of the resistance change near the first electrode. FIG. 5A is a graph showing structure characteristics for verifying the resistance change characteristics near the second electrode of TaN when the nonvolatile storage element includes the first electrode of Pt, the variable resistance layer including the second transition metal oxide layer comprising $TaO_y$, and the second electrode of TaN, that is, when the conventional two-layer structure ($TaO_x/TaO_y$) is used. FIG. 5B is a graph showing characteristics of the nonvolatile storage element that includes the first electrode of Pt, the variable resistance layer formed by stacking the second transition metal oxide layer comprising $TaO_y$ and the third transition metal oxide layer comprising $TaO_z$, and the second electrode of TaN and verifies the effect of the present invention, that is, the structure in which the third transition metal oxide layer comprising $TaO_z$ is provided between the second transition metal oxide layer comprising $TaO_y$ and the second electrode. FIG. 5C is a graph showing characteristics of the nonvolatile storage element that includes the first electrode of Pt, the variable resistance layer formed by stacking the second transition metal oxide layer comprising $TaO_y$ and the third transition metal oxide layer comprising $TaO_z$, and the second electrode of Ti and verifies the effect of the present invention, that is, a structure in which the second electrode is made of Ti that is an electrode material less prone to cause the resistance change than TaN. In any of the elements, by not providing the first transition metal oxide layer comprising $TaO_x$ on the side of the first electrode, it is possible to enhance and extract motion near the second electrode without being buried in motion in the interface of the first electrode. In each of FIGS. 5A to 5C, the horizontal axis indicates a total pulse application count of a negative pulse applied to the second electrode and a positive pulse applied to the first electrode, and the vertical axis indicates a resistance value at the time of the application.

From FIG. 5A, the motion in the interface of the second electrode of TaN of the conventional nonvolatile storage element is observed as the resistance change until the pulse application count reaches 45. However, in FIG. 5B, since the third transition metal oxide layer comprising $TaO_z$ having the low oxygen content atomic percentage is inserted, the motion is settled when the pulse application count is 17, and subsequently remains the same. Moreover, in FIG. 5C, in the case where the second electrode is made of Ti having the standard electrode potential lower than that of TaN, the motion is settled when the pulse application count is approximately 5. From these results, by providing the third transition metal oxide layer comprising $TaO_z$ having the lowest oxygen content atomic percentage to be in contact with the electrode in which the oxidation and the reduction reaction are to be inhibited, it is possible to reduce the occurrence of the resistance change operation (malfunction) in the region near the interface of the electrode, to achieve more stable memory characteristics. In addition, a synergy effect is expected by combining the third transition metal oxide layer comprising $TaO_z$ and the electrode having the low standard electrode potential.

Although the variable resistance layer 115 has a simple planar structure in the above-shown variable resistance nonvolatile storage element 10 according to Embodiment 1 of the present invention, the present invention is not limited to the structure. For instance, in consideration of a hole structure favorable for miniaturization, as long as the first transition metal oxide layer having the high oxygen content atomic percentage is formed to be in contact with the first electrode in which the oxidation and the reduction reaction are to be facilitated, the third transition metal oxide layer having the low oxygen content atomic percentage is formed to be in contact with the second electrode in which the oxidation and the reduction reaction are to be inhibited, the second transition metal oxide layer having the oxygen content atomic percentage halfway between the oxygen content atomic percentages of the first transition metal oxide layer and the third transition metal oxide layer is formed in part of the region between the first transition metal oxide layer and the third transition metal oxide layer, the variable resistance layer 115 may have any shape such as a mesa shape and a reverse mesa shape.

Embodiment 2

FIG. 6 is a cross-sectional view showing an exemplary structure of a variable resistance nonvolatile storage element 20 according to Embodiment 2 of the present invention. The variable resistance nonvolatile storage element 20 differs from the variable resistance nonvolatile storage element 10 according to Embodiment 1 of the present invention shown in FIG. 1 in that each of the layers included in the variable resistance layer, the first electrode, and the second electrode are provided upside down. In other words, a first electrode 106 is provided below a second electrode 104 in this embodiment, whereas the first electrode 106 is provided above the second electrode 104 in Embodiment 1.

As shown in FIG. 6, although a variable resistance layer 125 of the variable resistance nonvolatile storage element 20 according to Embodiment 2 has a stack structure including three layers of a first transition metal oxide layer 125x, a second transition metal oxide layer 125y, and a third transition metal oxide layer 125z, the first transition metal oxide layer 125x and the third transition metal oxide layer 125z are provided to be in contact with the first electrode 106 serving as the lower electrode and the second electrode 104 serving as the upper electrode, respectively. These transition metal oxides are of the same type. The transition metal oxide comprised in the first transition metal oxide layer 125x has an oxygen content atomic percentage higher than that of the transition metal oxide comprised in the second transition metal oxide layer 125y, and the transition metal oxide comprised in the third transition metal oxide layer 125z has an oxygen content atomic percentage lower than that of the transition metal oxide comprised in the second transition metal oxide layer 125y. To put it another way, the first transition metal oxide layer 125x, the second transition metal oxide layer 125y, and the third transition metal oxide layer 125z in this embodiment correspond to the first transition metal oxide layer 115x, the second transition metal oxide layer 115y, and the third transition metal oxide layer 115z, respectively.

It is to be noted that a variable resistance element 20a includes the first electrode (lower electrode) 106, the variable resistance layer 125, and the second electrode (upper electrode) 104.

Each of FIGS. 7A to 7F is a cross-sectional view showing a method for manufacturing the principal part of the variable resistance nonvolatile storage element 20 (here, the variable resistance element 20a) according to Embodiment 2. The following describes the method for manufacturing the principal part of the variable resistance nonvolatile storage element 20 according to Embodiment 2, with reference to the figures. It is to be noted that a case where the first, second, and third transition metal oxide layers comprise a tantalum oxide (TaO) is described below.

As shown in FIG. 7A, to form the first electrode (lower electrode) 106, a conductive layer 1060 that is to be the first electrode (lower electrode) 106 after patterning and comprises platinum is formed on a substrate 100 on which a transistor, a lower-layer line, and so on are formed. Here, since the conductive layer 1060 can be sintered in advance, for example, at a high temperature (400° C.) so that stress migration by heat is prevented from occurring in the first electrode in a post process, it is possible to stabilize an interface between the first electrode 106 and the first transition metal oxide layer 125x, to achieve stable device operations.

Next, as shown in FIG. 7B, to form the first transition metal oxide layer 125x, a first transition metal oxide layer 125x0 that comprises a transition metal oxide having the highest oxygen content atomic percentage is formed on the first electrode 106. Here, the first transition metal oxide layer 125x0 is formed by the reactive sputtering for sputtering a tantalum target in an oxygen gas atmosphere (power: 1600 W, film formation pressure: 0.16 Pa, gas flow rate: $Ar/O_2$=30/25 sccm). When a tantalum oxide layer as the first transition metal oxide layer is expressed as $TaO_x$, its oxygen content atomic percentage, resistivity, and film thickness are x=2.4, greater than or equal to $10^7$ mΩcm, and 5 nm, respectively. Although the first transition metal oxide layer 125x0 is formed by the reactive sputtering above, the manufacturing method may include a step of plasma oxidation. The sputtering usually has difficulty including more oxygen than defined by a stoichiometric composition, but the plasma oxidation injects oxygen into grain boundaries, faults, or the like of the tantalum oxide, thereby making it possible to form a transition metal oxide layer having a higher oxygen content atomic percentage. As a result, the plasma oxidation is effective in reducing a leak current. For instance, it is possible to form a transition metal oxide layer that comprises tantalum having x=2.4 and a film thickness of approximately 5 nm, by processing at a film formation temperature of 300° C. and a power of 200 W for 15 seconds.

Next, as shown in FIG. 7C, to form the second transition metal oxide layer 125y, a second transition metal oxide layer 125y0 that comprises a transition metal oxide is formed on the first transition metal oxide layer 125x0. Here, the second transition metal oxide layer 125y0 is similarly formed by the reactive sputtering for sputtering a tantalum target in an oxygen gas atmosphere (power: 1600 W, film formation pressure: 0.16 Pa, gas flow rate: $Ar/O_2$=34.7/20.3 sccm). When a tantalum oxide layer as the second transition metal oxide layer is expressed as $TaO_y$, its oxygen content atomic percentage, resistivity, and film thickness are y=1.29, 6 mΩcm, and 35 nm, respectively.

Next, as shown in FIG. 7D, to form the third transition metal oxide layer 125z, a third transition metal oxide layer 125z0 that comprises a transition metal oxide having the lowest oxygen content atomic percentage is formed on the second transition metal oxide layer 125y0. Here, the third transition metal oxide layer 125z0 is formed by reactive sputtering for sputtering a tantalum target in an argon and oxygen gas atmosphere (power: 1600 W, film formation pressure: 0.16 Pa, gas flow rate: $Ar/O_2$=43/12 sccm). When a tantalum oxide layer as the third transition metal oxide layer is expressed as $TaO_z$, its oxygen content atomic percentage, resistivity, and film thickness are z=0.68, 0.33 mΩcm, and 10 nm, respectively. Stated differently, regarding the film thicknesses of the three transition metal oxide layers, the second transition metal oxide layer 125y has a film thickness greater than those of the first transition metal oxide layer 125x and the third transition metal oxide layer 125z.

Although the tantalum target is used in forming each layer included in the variable resistance layer, a tantalum oxide target for which an oxygen content is adjusted in advance may be used.

Next, as shown in FIG. 7E, to form the second electrode (upper electrode) 104, a conductive layer 1040 that is to be the second electrode (upper electrode) 104 after patterning and comprises a tantalum nitride is formed on the third transition metal oxide layer 125z0.

Finally, as shown in FIG. 7F, to form the variable resistance element 20a, the conductive layer 1060, the first transition metal oxide layer 125x0, the second transition metal oxide layer 125y0, the third transition metal oxide layer 125z0, and the conductive layer 1040 are patterned using a desired mask. The formed variable resistance element 20a includes, between the first electrode (lower electrode) 106 and the second electrode (upper electrode) 104, the variable resistance layer 125 having a three-layer stack structure of the first transition metal oxide layer 125x, the second transition metal oxide layer 125y, and the third transition metal oxide layer 125z. Although the patterning is collectively performed using the same mask in this step, patterning may be performed for each step.

The above manufacturing method makes it possible to form the first, second, and third transition metal oxide layers comprising the respective transition metal oxides having mutually different oxygen content atomic percentages according to oxygen flow rates, and differentiate the first, second, and third transition metal oxide layers. In other words, it is possible to manufacture the nonvolatile storage element that selectively causes the oxidation and the reduction reaction of the first transition metal oxide in the region near the interface between the first transition metal oxide layer and the lower electrode (first electrode), to always stabilize a polarity of resistance change, and, at the same time, reduces the occurrence of the resistance change operation (malfunction) caused by the oxidation and the reduction reaction in the region near the interface between oxidation and the reduction reaction and the upper electrode (second electrode), to achieve stable memory characteristics.

It is to be noted that a step of oxidizing the first transition metal oxide layer 125x may be further added to the above method for manufacturing the nonvolatile storage element 20. For instance, the first transition metal oxide layer 125x may be oxidized immediately after the first transition metal oxide layer 125x0 is formed or the first transition metal oxide layer 125x is formed by patterning. With this, it is possible to further increase the oxygen content atomic percentage of the first transition metal oxide layer 125x, and produce an effect of reducing the leak current. In addition, it is possible to reduce the influence of the oxygen diffusion caused by the heat treatment in the post process, and more surely cause the oxidation and the reduction reaction in one of the electrodes.

Embodiment 3

FIG. 8 is a cross-sectional view showing an exemplary structure of a variable resistance nonvolatile storage element 30 according to Embodiment 3 of the present invention. Although the variable resistance nonvolatile storage element 30 has the same constituent elements as the variable resistance nonvolatile storage element 10 according to Embodiment 1 of the present invention shown in FIG. 1, the variable resistance nonvolatile storage element 30 differs from the variable resistance nonvolatile storage element 10 in a film thickness and a resistivity of each of the layers included in the variable resistance layer.

To put it another way, in the nonvolatile storage element 10 according to Embodiment 1, the first to third transition metal oxide layers comprise the tantalum oxide. Here, $TaO_z$ as the third transition metal oxide layer 115z has an oxygen content atomic percentage of z=0.68 (resistivity: 0.38 mΩcm) and a film thickness of 10 nm, $TaO_y$ as the second transition metal oxide layer 115y has an oxygen content atomic percentage of y=1.29 (resistivity: 6 mΩcm) and a film thickness of 35 nm, and $TaO_x$ as the first transition metal oxide layer 115x has an oxygen content atomic percentage of x=2.4 (resistivity: not less than $10^7$ mΩcm) and a film thickness of 5 nm. The third transition metal oxide layer 115z has a reduced oxygen content atomic percentage with respect to the first transition metal oxide layer 115x and the second transition metal oxide layer 115y so that an erroneous resistance change does not occur in the interface of the second electrode 104 due to the diffusion of oxygen. In contrast, in the nonvolatile storage element 30 according to this embodiment, although the first to third transition metal oxide layers similarly comprise the tantalum oxide (TaO), $TaO_z$ as a third transition metal oxide layer 135z has an oxygen content atomic percentage of z=1.22 (resistivity: 2 mΩcm) and a film thickness of 35 nm, $TaO_y$ as a second transition metal oxide layer 135y has an oxygen content atomic percentage of y=1.63 (resistivity: 10 mΩcm) and a film thickness of 10 nm, and $TaO_x$ as a first transition metal oxide layer 135x has an oxygen content atomic percentage of x=2.4 (resistivity: not less than $10^7$ mΩcm) and a film thickness of 5 nm. Stated differently, regarding the film thicknesses of the three transition metal oxide layers, the third transition metal oxide layer 135z has a film thickness greater than those of the first transition metal oxide layer 135x and the second transition metal oxide layer 135z.

To maintain oxygen concentration of the first transition metal oxide layer 135x whose oxygen is most likely to diffuse due to the oxygen concentration that is highest and in which change of an oxygen profile influences resistance change characteristics, the second transition metal oxide layer 135y is provided below the first transition metal oxide layer 135x to design the oxygen profile. In other words, in terms of the oxygen content atomic percentage, a variable resistance layer 135 includes the first transition metal oxide layer 135x having a high oxygen concentration, the second transition metal oxide layer 135y having a medium oxygen concentration, and the third transition metal oxide layer 135z having a low oxygen concentration in this embodiment, while the variable resistance layer 115 includes the first transition metal oxide layer 115x having the high oxygen concentration, the second transition metal oxide layer 115y having the low oxygen concentration, and the third transition metal oxide layer 115z having the ultralow oxygen concentration in Embodiment 1.

It is to be noted that a variable resistance element 30a includes the first electrode (upper electrode) 106, the variable resistance layer 135, and the second electrode (lower electrode) 104.

FIG. 9 is a graph showing a relationship between a sheet resistivity and an oxygen content atomic percentage of a variable resistance layer comprising a tantalum oxide. The respective oxygen content atomic percentages of the first transition metal oxide layer 135x, the second transition metal oxide layer 135y, and the third transition metal oxide layer 135z are 72.5% (stoichiometric ratio), 62% (oxygen deficiency), and 55% (oxygen deficiency), respectively. By providing the second transition metal oxide layer 135y having a relatively high oxygen content atomic percentage as a middle layer so that a longitudinal gradient of the oxygen content atomic percentages is graded, it is possible to reduce the diffusion of oxygen due to the concentration gradient. Moreover, the oxygen diffuses via a region where the oxygen is deficient. To put it another way using a deficient amount from a stoichiometric composition, the first transition metal oxide layer 135x has the deficient amount of approximately 0% (approximately stoichiometric composition), the second transition metal oxide layer 135y has the deficient amount of 9.5% (oxygen deficiency), and the third transition metal oxide layer 135z has the deficient amount of 17.5% (oxygen deficiency). When the second transition metal oxide layer 135y having the less deficient amount is provided as the middle layer, by decreasing the number of diffusion paths, it is also possible to reduce the diffusion of oxygen.

FIG. 10 is a graph showing a relationship between a cell current and a structure of a variable resistance layer of a nonvolatile storage element. The horizontal axis indicates a resistivity of an upper oxygen-deficient layer (the second transition metal oxide layer), and the vertical axis indicates a HR cell current in a high resistance state and a LR cell current in a low resistance state. Here, the characteristics of the conventional nonvolatile storage element 90 in which an oxygen-deficient layer is single-layered are plotted with circles, and the characteristics of the nonvolatile storage element 30 according to this embodiment in which the oxygen-deficient layer is double-layered are plotted with triangles and squares. The triangles show the data of the nonvolatile storage element 30 in which a lower oxygen-deficient layer (the third transition metal oxide layer) has a resistivity of 2 mΩcm, while the squares show the data of the nonvolatile storage element 30 in which a lower oxygen-deficient layer (the third transition metal oxide layer) has a resistivity of 1 mΩcm.

It is clear from FIG. 10 that although the conventional nonvolatile storage element 90 is formed by stacking a high resistance layer (the first transition metal oxide layer 105x) and the oxygen-deficient layer (the second transition metal oxide layer 105y), when the resistivity of the oxygen-deficient layer increases, a LR cell current decreases. This suggests a trade-off relationship that although it is possible to reduce the diffusion of oxygen when the oxygen content atomic percentage of the oxygen-deficient layer is increased to approximate the stoichiometric composition so that the oxygen profile is reduced, it is impossible to ensure a sufficient memory window (a difference between a LR cell current and a HR cell current) due to the decrease in the LR cell current.

In contrast, in the nonvolatile storage element 30 according to this embodiment, the trade-off is resolved by forming an oxygen-deficient layer below a high resistance layer (the first transition metal oxide layer 135x) using the second transition metal oxide layer 135y and the third transition metal oxide layer 135z, giving the function of reducing the diffusion of oxygen to the second transition metal oxide layer 135y above the third transition metal oxide layer 135z, and giving the function of increasing the cell current to the third transition metal oxide layer 135z below the second transition metal oxide layer 135y. It is clear from FIG. 10 that the LR cell current increases more in the structure (i.e., the nonvolatile storage element 30 according to this embodiment) in which the oxygen-deficient layer is double-layered than in the structure (i.e., the conventional nonvolatile storage element 90) in which the oxygen-deficient layer is single-layered.

FIG. 11 is a graph showing a relationship between endurance characteristics and a structure of the variable resistance layer of the nonvolatile storage element 30 according to this embodiment. The horizontal axis indicates the structure of the variable resistance layer, the left vertical axis indicates a failure ratio (arbitrary unit) between a HR failure that prevents a change to high resistance and a LR failure that prevents a change to low resistance, and the right vertical axis indicates a hundred thousand times endurance pass rate (arbitrary unit) of a memory cell array including nonvolatile storage elements including such a nonvolatile storage element 30. In FIG. 11, a pair of the LR failure ratio (the left bar) and the HR failure ratio (the right bar) is shown in each of the left side, the center, and the right side of the graph as data corresponding to the left vertical axis. In addition, three black circles are plotted as data corresponding to the right vertical axis. In FIG. 11, the left side and the center correspond to the conventional nonvolatile storage element, and show a situation where the second transition metal oxide layer has a resistivity of 2 mΩcm and a film thickness of 30 nm and a situation where the second transition metal oxide layer has a resistivity of 3 mΩcm and a film thickness of 30 nm, respectively. Moreover, in FIG. 11, the right side corresponds to the nonvolatile storage element according to this embodiment, and shows a situation where the oxygen-deficient layer has a stack structure of two layers (the second transition metal oxide layer and the third transition metal oxide layer), the second transition metal oxide layer has a resistivity of 6 mΩcm and a film thickness of 10 nm, and the third transition metal oxide layer has a resistivity of 2 mΩcm and a film thickness of 20 nm.

As is clear from the bars in the left side and the center of FIG. 11, the conventional nonvolatile storage element 90 also has the trade-off that the number of HR failures increases as the resistivity of the oxygen-deficient layer (the second transition metal oxide layer) is decreased, and the number of LR failures increases as the resistivity of the oxygen-deficient layer is increased. In contrast, as is clear from the bars in the right side of FIG. 11 and the plotted black circles, by forming the oxygen-deficient layer to include the two layers as in the nonvolatile storage element 30 according to this embodiment, it is possible to not only reduce the number of both the HR failures and the LR failures but also increase the endurance characteristics pass rate. Stated differently, it is possible to enhance a reliability of the number of operations of writing to cause resistance change that is significant as the potential of the nonvolatile memory.

It is to be noted that as can be seen from the results shown in FIG. 11, the structure according to this embodiment has significance in forming the oxygen-deficient layer to have the two-layer stack structure and thickening the third transition metal oxide layer more than the second transition metal oxide layer. Consequently, the relationship between the film thickness of the first transition metal oxide layer and that of the second transition metal oxide layer may be opposite to the magnitude relationship of the film thickness described in Embodiment 1 of the present invention, that is, the first transition metal oxide layer may be thickened more than the second transition metal oxide layer.

It is to be noted that a method for manufacturing the nonvolatile storage element 30 can easily result from performing sputtering after the ratio between the argon and the oxygen gas is changed in the steps of the method for manufacturing the nonvolatile storage element 10 shown in FIGS. 2B and 2C.

Embodiment 4

FIG. 12 is a cross-sectional view showing an exemplary structure of a variable resistance nonvolatile storage element 40 according to Embodiment 4 of the present invention. Here, a variable resistance layer 145 is four-layered to have both the characteristics of the variable resistance nonvolatile storage element 10 according to Embodiment 1 of the present invention shown in FIG. 1 and those of the variable resistance nonvolatile storage element 30 according to Embodiment 3 of the present invention shown in FIG. 8.

In other words, in the nonvolatile storage element 40 according to this embodiment, the first to fourth transition metal oxide layers comprise a tantalum oxide (TaO). Here, $TaO_a$ as a fourth transition metal oxide layer 145a has an oxygen content atomic percentage of a=0.68 (resistivity: 0.33 mΩcm) and a film thickness of 10 nm, $TaO_z$ as a third transition metal oxide layer 145z has an oxygen content atomic percentage of z=1.22 (resistivity: 2 mΩ·cm) and a film thickness of 25 nm, $TaO_y$ as a second transition metal oxide layer 145y has an oxygen content atomic percentage of y=1.63 (resistivity: 10 mΩcm) and a film thickness of 10 nm, and $TaO_x$ as a first transition metal oxide layer 145x has an oxygen content atomic percentage of x=2.4 (resistivity: not less than $10^7$ mΩcm) and a film thickness of 5 nm. Stated differently, regarding the film thicknesses of the four transition metal oxide layers, the third transition metal oxide layer 145z has a film thickness greater than those of the first transition metal oxide layer 145x, the second transition metal oxide layer 135z, and the fourth transition metal oxide layer 145a. In this embodiment, the variable resistance layer 145 includes the first transition metal oxide layer 145x having a high oxygen concentration, the second transition metal oxide layer 145y having a medium oxygen concentration, the third transition metal oxide layer 145z having a low oxygen concentration, and the fourth transition metal oxide layer 145a having a ultralow oxygen concentration.

With this structure, first, it is possible to prevent an erroneous resistance change from occurring in an interface of a second electrode 104, by providing the fourth transition metal oxide layer 145a having a significantly reduced oxygen content atomic percentage, and second, it is possible to prevent oxygen from diffusing from the first transition metal oxide layer 145x having a substantial stoichiometric ratio toward the lower layer, by providing the second transition metal oxide layer 145y having a relatively high oxygen content atomic percentage.

It is to be noted that a variable resistance element 40a includes a first electrode (upper electrode) 106, the variable resistance layer 145, and the second electrode (lower electrode) 104.

From the above, it is possible to prevent the oxygen from increasing near the interface of the electrode where resistance change does not occur, achieve a stable operation of initial breakdown, prevent an operating voltage from increasing or varying, and enhance the reliability of the number of operations of writing to cause resistance change. In particular, it is possible to significantly reduce a probability of a malfunction of part of bits in a large-capacity gigabit-class (Gbit) memory, thereby realizing a large-capacity nonvolatile memory.

It is to be noted that a method for manufacturing the nonvolatile storage element 40 can easily result from performing sputtering after the ratio between the argon and the oxygen gas is changed as in the steps of the method for manufacturing the nonvolatile storage element 10 shown in FIGS. 2B and 2C, and further stacking the fourth transition metal oxide layer 145a before the third transition metal oxide layer is formed.

Although the nonvolatile storage element and the method for manufacturing the same according to the present invention have been described based on Embodiments 1 to 4 above, the present invention is not limited to these embodiments. Those skilled in the art will readily appreciate that various modifications may be made in each of the embodiments and that other embodiments may be obtained by arbitrarily combining the features of each embodiment without materially departing from the gist of the present invention. Accordingly, all such modifications and other embodiments are included in the present invention.

For instance, a nonvolatile storage element obtained by vertically inverting the structure of the nonvolatile storage element according to Embodiments 3 and 4 is included in the present invention.

Moreover, although the nonvolatile storage element according to the present invention basically has the structure including the variable resistance element and the peripheral constituent elements (a substrate, a line, a contact plug, and an interlayer insulating layer), the nonvolatile storage element may include a single variable resistance element. To put it another way, the nonvolatile storage element according to the present invention may include at least the first electrode, the second electrode, and the variable resistance layer, and may not necessarily include the peripheral constituent elements. As is clear from Embodiments 1 to 4, the present invention is characterized by the variable resistance layer in the nonvolatile storage element.

Furthermore, although the cases where the first, second, third, and fourth transition metal oxide layers comprise the tantalum oxide, the hafnium oxide, or the zirconium oxide have been described in the embodiments, the first, second, third, and fourth transition metal oxide layers may comprise a material, as long as the material allows resistance change to occur, when a transition metal oxide layer having a high oxygen concentration is formed near an interface of an electrode. In addition, a main variable resistance layer of which resistance changes may include, as the first to third transition metal oxide layers provided between the upper and lower electrodes, oxide layers each comprising tantalum, hafnium, zirconium, or the like, and the oxide layer may comprise, for example, a slight amount of a chemical element other than tantalum, hafnium, and zirconium. It is also possible to intentionally include a small amount of the other chemical element by, for instance, slightly adjusting a resistance value, and such a case is also included in the present invention. Moreover, although, when a resistance film is formed by sputtering, a slight amount of a chemical element can be unintentionally mixed into the resistance film due to release of residual gas or gas through a vacuum vessel wall, the case where such a slight amount of the chemical element is mixed into the resistance film should be also included in the present invention.

INDUSTRIAL APPLICABILITY

The present invention provides a variable resistance nonvolatile storage element suitable for a larger capacity and a method of manufacturing the same, and is useful for various electronic device fields using a nonvolatile memory that stably operates and is highly reliable, because the present invention achieves the nonvolatile memory.

REFERENCE SIGNS LIST

10 Variable resistance nonvolatile storage element according to Embodiment 1 of the present invention
10a Variable resistance element according to Embodiment 1 of the present invention
20 Variable resistance nonvolatile storage element according to Embodiment 2 of the present invention
20a Variable resistance element according to Embodiment 2 of the present invention
30 Variable resistance nonvolatile storage element according to Embodiment 3 of the present invention
30a Variable resistance element according to Embodiment 3 of the present invention
40 Variable resistance nonvolatile storage element according to Embodiment 4 of the present invention
40a Variable resistance element according to Embodiment 4 of the present invention
100 Substrate
101 First line
102 First interlayer insulating layer
103 First contact plug
104 Second electrode
1040 Conductive layer to be second electrode
115, 125, 135, 145 Variable resistance layer
115x, 115x0, 125x, 125x0, 135x, 145x First transition metal oxide layer
115y, 115y0, 125y, 125y0, 135y, 145y Second transition metal oxide layer
115z, 115z0, 125z, 125z0, 135z, 145z Third transition metal oxide layer
145a Fourth transition metal oxide layer
106 First electrode
1060 Conductive layer to be first electrode
107 Second interlayer insulating layer
108 Second contact plug
109 Second line

The invention claimed is:
1. A nonvolatile storage element comprising:
a first electrode;
a second electrode; and
a variable resistance layer provided between the first electrode and the second electrode, and having a resistance value that reversibly changes based on an electrical signal applied between the first electrode and the second electrode,
wherein the variable resistance layer includes a first transition metal oxide layer, a second transition metal oxide layer, and a third transition metal oxide layer, the first transition metal oxide layer having a composition expressed as $MO_x$ (where M is a transition metal and O is oxygen), the second transition metal oxide layer having a composition expressed as $MO_y$ (where x>y), and the third transition metal oxide layer having a composition expressed as $MO_z$ (where y>z),
wherein the second transition metal oxide layer is directly stacked on the first transition metal oxide layer,
wherein the third transition metal oxide layer is directly stacked on the second transition metal oxide layer, and
wherein an oxygen content atomic percentage of the first transition metal oxide layer is greater than an oxygen content atomic percentage of the second transition metal oxide layer, and the oxygen content atomic percentage of the second transition metal oxide layer is greater than an oxygen content atomic percentage of the third transition metal oxide layer.

2. The nonvolatile storage element according to claim 1, wherein the first transition metal oxide layer is a layer in which a filament path is formed, the filament path being a micro region of which resistance changes.

3. The nonvolatile storage element according to claim 1, wherein a filament path is formed in the first transition metal oxide layer, the filament path being a micro region of which resistance changes such that a resistance of the nonvolatile element changes, after an initial breakdown of the nonvolatile storage element is performed by applying, to the nonvolatile memory element, a voltage having an absolute value higher than an absolute value of a voltage applied in a normal operation.

4. The nonvolatile storage element according to claim 1, wherein the first transition metal oxide layer is an insulating layer before an initial breakdown of the nonvolatile storage element is performed.

5. The nonvolatile storage element according to claim 1, wherein the second transition metal oxide layer has a film thickness greater than a film thickness of the first transition metal oxide layer and a film thickness of the third transition metal oxide layer.

6. The nonvolatile storage element according to claim 1, wherein the third transition metal oxide layer has a film thickness greater than a film thickness of the first transition metal oxide layer and a film thickness of the second transition metal oxide layer.

7. The nonvolatile storage element according to claim 1, wherein the variable resistance layer further includes a fourth transition metal oxide layer stacked on the third transition metal oxide layer, the fourth transition metal oxide layer having a composition expressed as $MO_a$ (where $z>a$).

8. The nonvolatile storage element according to claim 1, wherein the first electrode and the first transition metal oxide layer are connected to each other, wherein the second electrode and the third transition metal oxide layer are connected to each other, wherein the first electrode and the second electrode include respective materials having mutually different chemical elements as main components, and wherein a standard electrode potential V1 of the first electrode, a standard electrode potential V2 of the second electrode, and a standard electrode potential Vt of the transition metal M satisfy Vt<V1 and V2<V1.

9. The nonvolatile storage element according to claim 8, wherein the first electrode is provided above the second electrode.

10. The nonvolatile storage element according to claim 8, wherein the first electrode is provided below the second electrode.

11. The nonvolatile storage element according to claim 1, wherein the first transition metal oxide layer, the second transition metal oxide layer, and the third transition metal oxide layer comprise a tantalum oxide, a hafnium oxide, or a zirconium oxide as a variable resistance material.

12. The nonvolatile storage element according to claim 11, wherein the transition metal M is tantalum, and wherein the first transition metal oxide layer comprising $TaO_x$, the second transition metal oxide layer comprising $TaO_y$, and the third transition metal oxide layer comprising $TaO_z$ satisfy $2.1 \leq x$, $0.8 \leq y \leq 1.9$, and $0<z<0.8$.

13. The nonvolatile storage element according to claim 11, wherein the transition metal M is hathium, and wherein the first transition metal oxide layer comprising $HfO_x$, the second transition metal oxide layer comprising $HfO_y$, and the third transition metal oxide layer comprising $HfO_z$ satisfy $1.8<x$, $0.9 \leq y \leq 1.6$, and $0<z<0.9$.

14. The nonvolatile storage element according to claim 11, wherein the transition metal M is zirconium, and wherein the first transition metal oxide layer comprising $ZrO_x$, the second transition metal oxide layer comprising $ZrO_y$, and the third transition metal oxide layer comprising $ZrO_z$ satisfy $1.9<x$, $0.9 \leq y \leq 1.4$, and $0<z<0.9$.

15. The nonvolatile storage element according to claim 11, wherein the transition metal M is tantalum, and wherein the first transition metal oxide layer comprising $TaO_x$, the second transition metal oxide layer comprising $TaO_y$, and the third transition metal oxide layer comprising $TaO_z$ satisfy $2.1 \leq x$, $0.8 \leq y \leq 1.9$, and $0.8 \leq z \leq 1.9$.

16. The nonvolatile storage element according to claim 11, wherein the transition metal M is hathium, and wherein the first transition metal oxide layer comprising $HfO_x$, the second transition metal oxide layer comprising $HfO_y$, and the third transition metal oxide layer comprising $HfO_z$ satisfy $1.8<x$, $0.9 \leq y \leq 1.6$, and $0.9 \leq z \leq 1.6$.

17. The nonvolatile storage element according to claim 11, wherein the transition metal M is zirconium, and wherein the first transition metal oxide layer comprising $ZrO_x$, the second transition metal oxide layer comprising $ZrO_y$, and the third transition metal oxide layer comprising $ZrO_z$ satisfy $1.9<x$, $0.9 \leq y \leq 1.4$, and $0.9 \leq z \leq 1.4$.

* * * * *